United States Patent
Shingai et al.

(10) Patent No.: US 11,510,292 B2
(45) Date of Patent: Nov. 22, 2022

(54) TRANSPARENT CONDUCTOR AND ORGANIC DEVICE

(71) Applicant: TDK CORPORATION, Tokyo (JP)

(72) Inventors: Hiroshi Shingai, Tokyo (JP); Akinori Nishizawa, Tokyo (JP); Shouhei Harada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 406 days.

(21) Appl. No.: 16/642,488

(22) PCT Filed: Aug. 29, 2018

(86) PCT No.: PCT/JP2018/031925
§ 371 (c)(1),
(2) Date: Feb. 27, 2020

(87) PCT Pub. No.: WO2019/044896
PCT Pub. Date: Mar. 7, 2019

(65) Prior Publication Data
US 2020/0260540 A1     Aug. 13, 2020

(30) Foreign Application Priority Data

Aug. 29, 2017    (JP) .............................. JP2017-164613
Aug. 29, 2017    (JP) .............................. JP2017-164615

(51) Int. Cl.
*H01L 51/54*      (2006.01)
*H05B 33/28*      (2006.01)
(Continued)

(52) U.S. Cl.
CPC ............ *H05B 33/28* (2013.01); *C23C 14/08* (2013.01); *H01B 5/14* (2013.01); *H01L 51/50* (2013.01); *H01L 2251/308* (2013.01)

(58) Field of Classification Search
CPC ........ H01G 9/2068; H01J 29/45; H01J 3/385; H01L 25/00; H01L 25/047; H01L 27/142;
(Continued)

(56) References Cited

U.S. PATENT DOCUMENTS 6,221,520 B1    4/2001   Takaki et al.
2001/0030170 A1   10/2001   Takaki et al.
(Continued)

FOREIGN PATENT DOCUMENTS

CN      101960638 A    1/2011
JP      H11-070610 A    3/1999
(Continued)

OTHER PUBLICATIONS

Translation of Feb. 16, 2021 Office Action issued in Japanese Patent Application No. 2019-539578.
(Continued)

*Primary Examiner* — Samuel Park
(74) *Attorney, Agent, or Firm* — Oliff PLC

(57) ABSTRACT

A transparent conductor includes a transparent substrate, a first metal oxide layer, a metal layer containing a silver alloy, a third metal oxide layer, and a second metal oxide layer in the order presented. The first metal oxide layer is composed of a metal oxide which is different from ITO, the second metal oxide layer contains ITO, and the work function of the surface of the second metal oxide layer opposite to the metal layer side is 4.5 eV or higher.

7 Claims, 11 Drawing Sheets

(51) Int. Cl.
*C23C 14/08* (2006.01)
*H01B 5/14* (2006.01)
*H01L 51/50* (2006.01)

(58) Field of Classification Search
CPC ........... H01L 31/02021; H01L 31/0203; H01L 31/0232; H01L 31/024; H01L 31/04; H01L 31/0443; H01L 31/0488; H01L 25/042; H01L 31/042; H01L 27/1421; H01L 27/3227; H01L 31/02008; H01L 31/02167; H01L 31/02168; H01L 31/02; H01L 31/0445; H01L 31/046; H01L 31/0468; H01L 31/0475; H01L 31/05; H01L 31/0504; H01L 31/0516; H01L 31/06; H01L 31/0725; H01L 31/073; H01L 31/0735; H01L 31/07; H01L 25/048; H01L 25/167; H01L 27/15; H01L 27/288; H01L 27/32; H01L 51/0032; H01L 51/05; H01L 51/00; H01L 51/50; H01L 2251/308; H01L 51/5218; H01L 2251/305; H02J 3/383; H02J 3/385; H02J 2300/24; H02J 2300/26; H05B 33/28; C23C 14/08; C23C 14/086; C23C 14/205; C23C 14/34; H01B 5/14
See application file for complete search history.

(56) References Cited

U.S. PATENT DOCUMENTS

| | | | |
|---|---|---|---|
| 2002/0180347 A1 | 12/2002 | Adachi et al. | |
| 2006/0232202 A1 | 10/2006 | Matsuda et al. | |
| 2010/0072884 A1* | 3/2010 | Tchakarov | B32B 17/10788 445/35 |
| 2011/0037379 A1* | 2/2011 | Lecamp | H01L 51/5265 313/503 |
| 2014/0291662 A1* | 10/2014 | Baisl | H01L 51/56 438/46 |
| 2016/0126486 A1* | 5/2016 | Scharner | H01L 51/0001 438/22 |
| 2017/0207411 A1* | 7/2017 | Hoefling | H01L 51/5212 |
| 2018/0024388 A1 | 1/2018 | Shingai et al. | |
| 2018/0197649 A1 | 7/2018 | Shingai et al. | |

FOREIGN PATENT DOCUMENTS

| | | |
|---|---|---|
| JP | 2002-015623 A | 1/2002 |
| JP | 2006-324016 A | 11/2006 |
| JP | 2009-147364 A | 7/2009 |
| JP | 2011-508400 A | 3/2011 |
| JP | 2017107825 A | 6/2017 |
| TW | 385375 B | 3/2000 |
| WO | 2015/068738 A1 | 5/2015 |
| WO | 2016/153034 A1 | 9/2016 |
| WO | 2017/099187 A1 | 6/2017 |

OTHER PUBLICATIONS

Mar. 3, 2020 International Preliminary Report on Patentability issued in International Patent Application No. PCT/JP2018/031925.
Dec. 4, 2018 Search Report issued in International Patent Application No. PCT/JP2018/031925.

* cited by examiner

TRANSPARENT CONDUCTOR AND ORGANIC DEVICE

TECHNICAL FIELD

The present disclosure relates to a transparent conductor and an organic device.

BACKGROUND ART

Transparent conductors, which have transparency and conductivity in combination, are used for various applications. Organic devices including organic EL displays, organic EL lighting, and organic thin-film solar cells are being put into practical use in recent years. Organic EL displays and organic EL lighting are composed, for example, of a transparent electrode layer (anode), organic layer, and reflective electrode layer (cathode) laminated on a transparent substrate made of glass or the like. A current flows between the electrodes on applying a voltage between the transparent electrode layer and the reflective electrode layer, and the organic layer emits light. The light generated in the organic layer passes through the electrodes, and is extracted to the outside. For this reason, a transparent electrode is used for at least one of the electrodes.

Patent Literature 1 discloses providing a laminate structure composed of a metal thin-film layer of a silver alloy sandwiched by a pair of transparent refractive index thin-film layers on a transparent base material made of glass or the like. ITO and so on are taken as examples of the material used for the transparent refractive index thin-film layers.

Patent Literature 2 discloses that an anode with high work function is used as the anode of an organic electroluminescence element in order to efficiently inject holes, and that electron injection efficiency can be enhanced by providing a layer of a transparent electrode material with high work function such as ITO.

CITATION LIST

Patent Literature

Patent Literature 1: Japanese Unexamined Patent Publication No. 2002-15623
Patent Literature 2: Japanese Unexamined Patent Publication No. 2006-324016

SUMMARY OF INVENTION

Technical Problem

An organic layer is laminated on transparent conductors for organic devices. Such a transparent conductor is required to be superior in conductivity. In addition to this, smooth migration of holes between the transparent conductor and the organic layer is needed to be achieved in order to enhance the luminous efficiency of the organic layer. If the organic device is an organic EL element, for example, it is required to efficiently inject holes from the transparent conductor into the organic layer. If the organic device is an organic thin-film solar cell, on the other hand, it is required for the transparent conductor to efficiently receive holes from the organic layer. Thus, increasing the work function of the transparent conductor, on which the organic layer is laminated, is effective for smooth migration of holes between the transparent conductor and the organic layer.

While conventional organic devices in the mainstream are rigid ones in which glass or the like is used for the substrate, bendable organic devices are recently demanded. If ITO (indium tin oxide) is used as an electrode material, increasing the conductivity is required to enhance the luminous efficiency of the organic device. To enhance the conductivity with use of ITO, the thickness of ITO is needed to be large. If the thickness of ITO is large, however, a concern arises with respect to disconnection caused by generation of cracks in bending. In addition, such a transparent conductor that an ITO layer and a conductive layer containing a silver alloy are directly contacting with each other poses a concern that the corrosion of the metal layer progresses to deteriorate the transparency and conductivity through long-time use under a high-temperature/high-humidity environment.

In such circumstances, an object of the present disclosure is, in one aspect, to provide a transparent conductor that is superior in conductivity, flexibility, and corrosion resistance and enables formation of organic devices with superior performance. An object of the present disclosure is, in another aspect, to provide an organic device that has superior performance and at the same time is superior in flexibility and corrosion resistance by virtue of inclusion of that transparent conductor.

An object of the present disclosure is, in still another aspect, to provide a transparent conductor that has superior conductivity and at the same time has high work function. An object of the present disclosure is, in further still another aspect, to provide an organic device that has superior performance by virtue of inclusion of the above-described transparent conductor.

Solution to Problem

The present disclosure provides, in one aspect, a transparent conductor comprising: a transparent substrate; a first metal oxide layer; a metal layer containing a silver alloy; and a second metal oxide layer, in the order presented, wherein the first metal oxide layer is composed of a metal oxide which is different from ITO, the second metal oxide layer contains ITO, and the work function of the surface of the second metal oxide layer opposite to the metal layer side is 4.5 eV or higher.

The transparent conductor can achieve high conductivity by virtue of inclusion of the metal layer containing a silver alloy, even when the thickness is small. Because the first metal oxide layer is composed of a metal oxide which is different from ITO, the corrosion of the metal layer caused by direct contact between ITO and the metal layer can be prevented. Thus, a transparent conductor having superior corrosion resistance and superior conductivity in combination can be obtained. Accordingly, the transparent conductor is superior in conductivity, flexibility, and corrosion resistance.

Moreover, the work function of the surface of the second metal oxide layer opposite to the metal layer side is 4.5 eV or higher. This allows, when an organic layer is provided on the second metal oxide layer to form an organic device, holes to efficiently migrate between the transparent conductor and the organic layer, enhancing the performance of the organic device. If the organic device is an organic EL element, for example, holes can be efficiently injected from the second metal oxide layer of the transparent conductor into the organic layer. If the organic device is an organic thin-film solar cell, holes can be efficiently extracted from the organic layer into the second metal oxide layer of the transparent conductor.

The transparent conductor may comprise a third metal oxide layer between the metal layer and the second metal oxide layer, wherein the third metal oxide layer may be composed of a metal oxide which is different from ITO and contain zinc oxide, indium oxide, titanium oxide, and tin oxide. The third metal oxide layer that is provided on the metal layer and contains zinc oxide, indium oxide, titanium oxide, and tin oxide is superior in conductivity. The metal layer containing a silver alloy is sandwiched by a pair of metal oxide layers each composed of a metal oxide which is different from ITO, namely, the first metal oxide layer and the third metal oxide layer. It follows that the metal layer and the second metal oxide layer containing ITO are not directly contacting with each other. Accordingly, the corrosion of the metal layer caused by direct contact between the metal layer containing a silver alloy and ITO can be sufficiently prevented.

It is preferable for the first metal oxide layer to contain zinc oxide, indium oxide, and titanium oxide. Thereby, the corrosion of the metal layer can be further prevented.

It is preferable that the carrier density of the second metal oxide layer be $3.5 \times 10^{20}$ [cm$^{-3}$] or lower. Thereby, the work function of the surface of the second metal oxide layer opposite to the metal layer side can be increased. Accordingly, this allows, when an organic layer is provided on the second metal oxide layer to form an organic device, holes to more smoothly migrate between the transparent conductor (transparent electrode) and the organic layer.

The present disclosure provides, in another aspect, a transparent conductor comprising: a transparent substrate; a first metal oxide layer; a metal layer containing a silver alloy; and a second metal oxide layer, in the order presented, wherein the second metal oxide layer contains ITO, and the ratio of peak area B in a binding energy region of 0.5 to 2.3 eV to peak area A in a binding energy region of 14 to 21 eV (B/A) in an X-ray photoelectron spectroscopy spectrum for the surface of the second metal oxide layer is $1.0 \times 10^{-3}$ or lower.

The transparent conductor has superior conductivity because the transparent conductor includes the metal layer containing a silver alloy between the first metal oxide layer and the second metal oxide layer. In addition, the transparent conductor has large work function because the ratio of peak area B in a binding energy region of 0.5 to 2.3 eV to peak area A in a binding energy region of 14 to 21 eV (B/A) is $1.0 \times 10^{-3}$ or lower. Although the reason for the increase in work function as the ratio (B/A) decreases is not necessarily clear, it is inferred as follows.

Work function is energy needed to extract an electron from a surface to infinity. X-ray photoelectron spectroscopy (XPS) is a method of measuring kinetic energy of photoelectrons emitted from a surface on irradiating the surface with an X-ray. Among binding energies measured in X-ray photoelectron spectroscopy, peak intensity in a region of 0.5 to 2.3 eV is inferred to indicate electron density (distribution or probability) in a top portion of a valence band in an energy band diagram. It is expected that if this peak intensity, that is, peak area B is smaller, the electron density in the vicinity of the surface is lower. In this case, the electron density in a top portion of the valence band is low and it follows that electrons are present at lower energy levels, and hence higher energy is needed to extract an electron. This is inferred to lead to achievement of higher work function in a surface. The transparent conductor, including the second metal oxide layer with high work function, allows holes to smoothly migrate when an organic layer is laminated thereon.

The reason for specifying not the value of peak area B but the ratio of peak area B to peak area A in a binding energy region of 14 to 21 eV (B/A) is as follows. In short, it is desired that variation among measurement apparatuses and measurement conditions be reduced and work function be increased with higher precision. Peak area A in a binding energy region of 14 to 21 eV depends on the peak intensity of indium, [In4d], contained as a primary component in ITO. Hence, variation among measurement apparatuses, measurement conditions, and so on can be sufficiently reduced by specifying as a ratio to peak area A.

The transparent conductor may comprise a third metal oxide layer between the metal layer and the second metal oxide layer. In other words, the transparent conductor may include a transparent substrate, a first metal oxide layer, a metal layer containing a silver alloy, a third metal oxide layer, and a second metal oxide layer in the order presented. Further, a water vapor barrier layer, a metal oxide layer having a composition different from that of the first metal oxide layer, or a metal nitride layer may be included between the transparent substrate and the first metal oxide layer.

It is preferable that the first metal oxide layer and the third metal oxide layer be each composed of a metal oxide which is different from ITO, the first metal oxide layer contain zinc oxide, indium oxide, and titanium oxide, and the third metal oxide layer contain zinc oxide, indium oxide, titanium oxide, and tin oxide.

The metal layer containing a silver alloy is sandwiched by a pair of metal oxide layers each composed of a metal oxide which is different from ITO, namely, the first metal oxide layer and the third metal oxide layer, and the metal layer and the second metal oxide layer containing ITO are not directly contacting with each other. For this reason, the corrosion of the metal layer caused by direct contact between the metal layer containing a silver alloy and ITO can be sufficiently prevented. The first metal oxide layer can further prevent the corrosion of the metal layer by virtue of inclusion of zinc oxide, indium oxide, and titanium oxide. On the other hand, the third metal oxide layer, which contains zinc oxide, indium oxide, titanium oxide, and tin oxide, is superior in conductivity. Thus, the conductivity can be further enhanced.

It is preferable that the work function of the surface of the second metal oxide layer opposite to the third metal oxide layer side be 4.5 eV or higher. This allows, when an organic layer is laminated, holes to more smoothly migrate. If the organic device is an organic EL element, for example, holes can be efficiently injected from the second metal oxide layer of the transparent conductor into the organic layer. If the organic device is an organic thin-film solar cell, holes can be extracted from the organic layer into the second metal oxide layer of the transparent conductor.

It is preferable that the thickness of the second metal oxide layer be 2 nm or larger. This can stably increase the work function of the surface of the second metal oxide layer opposite to the metal layer side. Thus, holes are allowed to more smoothly migrate between the transparent conductor (transparent electrode) and an organic layer.

It is preferable that the surface resistance value of the transparent conductor be 30 Ω/sq. or lower. Such low resistance allows the transparent conductor to be suitably used for various applications. In using for an organic device, for example, the performance of the organic device can be enhanced.

The present disclosure provides, in still another aspect, an organic device comprising the above-described transparent conductor. The surface of the second metal oxide layer of the above-described transparent conductor has high work function. Accordingly, the migration of holes over the organic layer in the organic device can be smoothed. The above-described transparent conductor is superior in conductivity, flexibility, and corrosion resistance. The organic device, including such a transparent conductor, has superior performance and at the same time is superior in flexibility and corrosion resistance.

Advantageous Effects of Invention

The present disclosure can provide, in one aspect, a transparent conductor that is superior in conductivity, flexibility, and corrosion resistance and enables formation of organic devices with superior performance. The present disclosure can provide, in another aspect, an organic device that has superior performance and is superior in flexibility and corrosion resistance by virtue of inclusion of the above-described transparent conductor.

The present disclosure can provide, in still another aspect, a transparent conductor that has superior conductivity and at the same time has high work function. The present disclosure can provide, in further still another aspect, an organic device that has superior performance by virtue of inclusion of the above-described transparent conductor.

DESCRIPTION OF EMBODIMENTS

Figure 1:
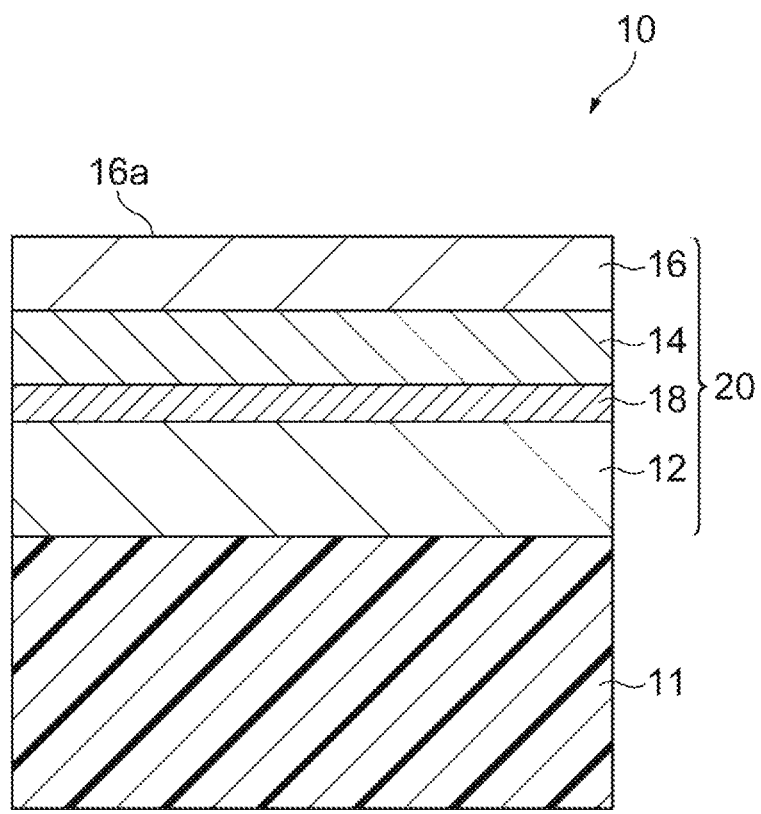
FIG. 1 shows a cross-sectional view schematically illustrating a first embodiment of the transparent conductor.

Hereinafter, some embodiments of the present disclosure will be described in detail with reference to the drawings. However, the embodiments below are examples to describe the present disclosure, and are not intended to limit the present disclosure to the contents below. In the descriptions, an identical reference sign is used for identical structures or components having identical function, and redundant descriptions are occasionally omitted. The positional relation such as up and down/left and right in a drawing is as illustrated in the drawing, unless otherwise specified. In addition, the dimensional ratio of each layer is not limited to that illustrated.

<Transparent Conductor>

First Embodiment

FIG. 1 shows a cross-sectional view schematically illustrating an embodiment of the transparent conductor. The transparent conductor 10 has a laminate structure in which a transparent substrate 11, a first metal oxide layer 12, a metal layer 18, a third metal oxide layer 14, and a second metal oxide layer 16 are disposed in the order presented.

The term "transparent" in the present specification means that visible light is transmitted, and a certain degree of light scattering is permitted. The degree of light scattering required for the transparent conductor 10 depends on the application thereof. What is called "semitransparent", which allows light scattering, is also included in the concept of "transparent" in the present specification. It is preferable that the degree of light scattering be smaller and the transparency be higher. The total light transmittance of the transparent conductor 10 as a whole is, for example, 82% or higher, preferably 85% or higher, and more preferably 88% or higher. The total light transmittance is transmittance for light including diffused transmitted light and determined by using an integrating sphere, and measured by using a commercially available haze meter.

The transparent substrate 11 is not limited, and may be any flexible transparent resin substrate. The transparent resin substrate may be an organic resin film, an organic resin sheet, or the like. Examples of the transparent substrate 11 include polyester films such as polyethylene terephthalate (PET) films and polyethylene naphthalate (PEN) films; polyolefin films such as polyethylene films and polypropylene films; polycarbonate films; acrylic films; norbornene films; polyarylate films; polyether sulfone films; diacetylcellulose films; polyimide films; and triacetylcellulose films. Among them, polyester films such as polyethylene terephthalate (PET) films and polyethylene naphthalate (PEN) films are preferred.

The thickness of the transparent substrate 11 is, for example, 200 μm or smaller to further enhance the flexibility of the transparent conductor 10. The refractive index of the transparent substrate is, for example, 1.50 to 1.70 to impart superior optical properties to the transparent conductor 10. The refractive index in the present specification is a value measured under conditions of $\lambda=633$ nm and a temperature of 20° C. The transparent substrate 11 may have been subjected to at least one surface treatment selected from the group consisting of corona discharge treatment, glow discharge treatment, flame treatment, ultraviolet irradiation treatment, electron beam irradiation treatment, and ozone treatment.

With the transparent substrate 11 being a transparent resin substrate, superior flexibility can be imparted to the transparent conductor 10. Thereby, the transparent conductor 10 can be suitably used as a transparent conductor for flexible organic devices.

The first metal oxide layer 12 is a transparent layer containing a metal oxide. The first metal oxide layer 12 has a function to protect the metal layer 18. The first metal oxide layer 12 is composed of a metal oxide which is different from ITO (indium tin oxide). The composition of the first metal oxide layer 12 is not limited, except that the first metal oxide layer 12 is free of ITO. Because the first metal oxide layer 12 is free of ITO, the corrosion of the silver alloy contained in the metal layer 18 can be prevented.

To achieve transparency and corrosion resistance in combination at an even higher level, the first metal oxide layer 12 may contain three components of zinc oxide, indium oxide, and titanium oxide as primary components, and may be composed of the three components and inevitable impurities.

The zinc oxide contained in the first metal oxide layer 12 is, for example, ZnO, and the indium oxide is, for example, $In_2O_3$. The titanium oxide is, for example, $TiO_2$. The ratio of metal atoms to oxygen atoms in each metal oxide may be deviated from the stoichiometric ratio. Another oxide with a different oxidation number may be contained. Although the first metal oxide layer 12 may contain tin oxide, it is preferable for reduction of the corrosion of the silver alloy contained in the metal layer 18 that the content of tin oxide ($SnO_2$) be lower, and it is more preferable that tin oxide be not contained. It is preferable that the total content of the three components in the first metal oxide layer 12 be 90% by mass or more, and it is more preferable that the total content of the three components in the first metal oxide layer 12 be 95% by mass or more, as the components are converted into ZnO, $In_2O_3$, and $TiO_2$ The thickness of the first metal oxide layer 12 is, for example, 60 nm or smaller to further enhance the transparency. To further enhance the corrosion resistance and at the same time enhance the productivity, on the other hand, the thickness may be, for example, 5 nm or larger, or may be 20 nm or larger.

As the zinc oxide, indium oxide, and titanium oxide in the first metal oxide layer 12 are converted into ZnO, $In_2O_3$, and $TiO_2$, respectively, it is preferable that the content of ZnO to the total of ZnO, $In_2O_3$, and $TiO_2$ be 20 to 85 mol %, and it is more preferable that the content of ZnO to the total of ZnO, $In_2O_3$, and $TiO_2$ be 30 to 80 mol %. With the same conversion, in order to enhance the transparency and achieve high conductivity and high corrosion resistance in combination, it is preferable that the content of $In_2O_3$ to the total of ZnO, $In_2O_3$, and $TiO_2$ be 10 to 35 mol %, and it is more preferable that the content of $In_2O_3$ to the total of ZnO, $In_2O_3$, and $TiO_2$ be 10 to 25 mol %.

With the same conversion, in order to achieve high transparency and superior corrosion resistance in combination, it is preferable that the content of $TiO_2$ to the total of ZnO, $In_2O_3$, and $TiO_2$ be 5 to 15 mol %, and it is more preferable that the content of $TiO_2$ to the total of ZnO, $In_2O_3$, and $TiO_2$ be 7 to 13 mol %.

The first metal oxide layer 12 may have low conductivity, and may be an insulator. In this case, the conductivity of the transparent conductor 10 may be compensated by the metal layer 18 and the third metal oxide layer 14. The first metal oxide layer 12 can be formed by using any of vacuum film formation methods including vacuum deposition methods, sputtering methods, ion plating methods, and CVD methods. Among them, sputtering methods are preferable because a smaller film-forming chamber can be used and the film-forming speed is high. Examples of sputtering methods include DC magnetron sputtering. For the target, a metal target or a metal oxide target can be used. The first metal oxide layer 12 may be a layer that does not dissolve in acidic etching solution. A water vapor barrier layer, a metal oxide layer having a composition different from that of the first metal oxide layer, or a metal nitride layer may be included between the transparent substrate 11 and the first metal oxide layer 12.

It is preferable for the metal layer 18 to contain a silver alloy as a primary component. The metal layer 18 may be a layer that dissolves in acidic etching solution. This allows easy patterning. By virtue of the metal layer 18 having high transparency and high conductivity, the surface resistance of the transparent conductor 10 can be sufficiently lowered with the visible light transmittance of the transparent conductor 10 kept sufficiently high. The constituent elements of the silver alloy are, for example, Ag and at least one selected from the group consisting of Pd, Cu, Nd, In, Sn, and Sb. Examples of the silver alloy include Ag—Pd, Ag—Cu, Ag—Pd—Cu, Ag—Nd—Cu, Ag—In—Sn, and Ag—Sn—Sb. It is preferable that the silver alloy contain Ag as a primary component and the above-mentioned metals as secondary components. The metal layer 18 may be a layer consisting only of metal.

The content of the metals other than Ag in the silver alloy is, for example, 0.5 to 5% by mass for further enhancement of corrosion resistance and transparency. It is preferable that the silver alloy contain Pd as a metal other than silver. Thereby, the corrosion resistance under a high-temperature/high-humidity environment can be further enhanced.

The thickness of the metal layer 18 may be, for example, 5 to 25 nm. If the thickness of the metal layer 18 is excessively small, the continuity of the metal layer 18 is impaired, and the surface resistance value of the transparent conductor 10 is likely to be higher. If the thickness of the metal layer 18 is excessively large, on the other hand, the sufficiently superior transparency is likely to be impaired.

The metal layer 18 has a function to adjust the conductivity and surface resistance of the transparent conductor 10. The metal layer 18 can be formed by using any of vacuum film formation methods including vacuum deposition methods, sputtering methods, ion plating methods, and CVD methods. Among them, sputtering methods are preferable because a smaller film-forming chamber can be used and the film-forming speed is high. Examples of sputtering methods including DC magnetron sputtering. For the target, a metal target can be used. The third metal oxide layer 14 is a transparent layer containing a metal oxide. The third metal oxide layer 14 has a function to protect the metal layer 18 and that to adjust the conductivity in combination. The third metal oxide layer 14 is composed of a metal oxide which is different from ITO. It is preferable that the third metal oxide layer 14 and the first metal oxide layer 12 have different compositions.

The third metal oxide layer 14 does not need to contain ITO as a primary component in order to sufficiently prevent the corrosion of the metal layer 18. The third metal oxide layer 14 may contain four components of zinc oxide, indium oxide, titanium oxide, and tin oxide, for enhancement of the conductivity. The third metal oxide layer 14 may contain the four components as primary components in order to keep the conductivity sufficiently high while the corrosion of the silver alloy contained in the metal layer 18 is prevented, and may be composed of the four components and inevitable impurities derived from impurities or the like contained in the oxide raw materials. It is preferable that the total content of the four components in the third metal oxide layer 14 be 90% by mass or more, and it is more preferable that the total content of the four components in the third metal oxide layer 14 be 95% by mass or more, as the components are converted into ZnO, $In_2O_3$, $TiO_2$, and $SnO_2$.

The zinc oxide is, for example, ZnO, and the indium oxide is, for example, $In_2O_3$. The titanium oxide is, for example, $TiO_2$, and the tin oxide is, for example, $SnO_2$. The ratio of metal atoms to oxygen atoms in each metal oxide may be deviated from the stoichiometric ratio. Another oxide with a different oxidation number may be contained.

As the zinc oxide, indium oxide, titanium oxide, and tin oxide in the third metal oxide layer 14 are converted into ZnO, $In_2O_3$, $TiO_2$, and $SnO_2$, respectively, it is preferable that the content of ZnO to the total of ZnO, $In_2O_3$, $TiO_2$, and $SnO_2$ be 20 to 60 mol %, and it is more preferable that the content of ZnO to the total of ZnO, $In_2O_3$, $TiO_2$, and $SnO_2$ be 25 to 50 mol %. With the same conversion, in order to achieve transparency, conductivity, and corrosion resistance at an even higher level, it is preferable that the content of $In_2O_3$ to the total of ZnO, $In_2O_3$, $TiO_2$, and $SnO_2$ be 10 to 40 mol %, and it is more preferable that the content of $In_2O_3$ to the total of ZnO, $In_2O_3$, $TiO_2$, and $SnO_2$ be 15 to 35 mol %.

With the same conversion, in order to achieve high transparency and superior corrosion resistance in combination, it is preferable that the content of $TiO_2$ to the total of ZnO, $In_2O_3$, $TiO_2$, and $SnO_2$ be 5 to 30 mol %, and it is more preferable that the content of $TiO_2$ to the total of ZnO, $In_2O_3$, $TiO_2$, and $SnO_2$ be 10 to 20 mol %. With the same conversion, in order to further enhance the conductivity, it is preferable that the content of $SnO_2$ to the total of ZnO, $In_2O_3$, $TiO_2$, and $SnO_2$ be 5 to 40 mol %, and it is more preferable that the content of $SnO_2$ to the total of ZnO, $In_2O_3$, $TiO_2$, and $SnO_2$ be 10 to 30 mol %.

The thickness of the third metal oxide layer 14 is, for example, 60 nm or smaller to lower the surface resistance of the transparent conductor 10 and at the same time further enhance the transparency. To further enhance the corrosion resistance of the transparent conductor 10 and at the same time enhance the productivity, on the other hand, the thickness is, for example, 5 nm or larger.

The second metal oxide layer 16 is a transparent layer containing a metal oxide. When being positioned adjacent to an organic layer of an organic device, for example, the second metal oxide layer 16 exhibits a function to smooth the migration of holes. The second metal oxide layer 16 is composed of a metal oxide containing ITO. The second metal oxide layer 16 may contain ITO as a primary component, and may be composed of ITO and inevitable impurities derived from impurities or the like contained in the raw material. It is preferable that the content of ITO in the second metal oxide layer 16 be 90% by mass or more, and it is more preferable that the content of ITO in the second metal oxide layer 16 be 95% by mass or more.

ITO is an oxide of indium and tin. This oxide is a composite oxide containing In, Sn, and O (oxygen) as constituent elements. The second metal oxide layer 16 may contain another composite oxide.

The work function of the surface 16a of the second metal oxide layer 16 opposite to the third metal oxide layer 14 side (metal layer 18 side) is 4.5 eV or higher, preferably a value over 4.7 eV, more preferably 5.0 eV or higher, and even more preferably 5.1 eV or higher. When an organic layer is provided on the surface 16a of the second metal oxide layer 16 with such high work function to fabricate an organic device, injection of holes into the organic layer or reception of holes from the organic layer can be performed in a sufficiently smooth manner. Accordingly, the performance of the organic device can be enhanced. The work function of the surface 16a of the second metal oxide layer 16 can be measured by using any commercially available measurement apparatus.

To increase the work function of the surface of a transparent electrode, for example, surface treatment such as UV ozone treatment and plasma treatment is performed. In this case, it is needed to additionally provide a step of surface treatment. On the other hand, the second metal oxide layer 16 of the present embodiment has high work function as a bulk, which is advantageous in that surface treatment is not required. However, further enhancement of the work function by surface treatment is not excluded.

The work function of the surface 16a of the second metal oxide layer 16 tends to depend on the composition in the vicinity of the surface 16a. For example, the work function of the surface 16a can be adjusted by changing the ratio of oxygen atoms in ITO. Specifically, in the case that the second metal oxide layer 16 is formed by DC magnetron sputtering with a target consisting of a sintered compact of ITO, the work function of the surface 16a of the second metal oxide layer 16 can be adjusted by changing the ratio of oxygen gas to inert gas in sputtering.

When a mixed gas of inert gas and oxygen gas is used as gas for sputtering, the work function of the surface 16a of the second metal oxide layer 16 tends to increase as the flow rate ratio of oxygen gas to inert gas increases.

The carrier density of the second metal oxide layer 16 is preferably $3.5 \times 10^{20}$ [cm$^{-3}$] or lower, and more preferably $2.5 \times 10^{20}$ [cm$^{-3}$]. If an organic layer is provided on the second metal oxide layer 16 having such low carrier density to fabricate an organic device, injection of holes into the organic layer or reception of holes from the organic layer can be performed in a sufficiently smooth manner. The carrier density of the second metal oxide layer 16 in the transparent conductor 10 can be determined by separately preparing a sample of a monolayer having the same composition and structure as the second metal oxide layer 16 in the transparent conductor 10 and measuring the carrier density of the sample with a commercially available measurement apparatus.

The surface resistance of the surface 16a of the second metal oxide layer 16 in the transparent conductor 10 is preferably 30 Ω/sq. or lower, and more preferably 25 Ω/sq. or lower. The transparent conductor 10 having such low surface resistance can be suitably used for various applications. In using for an organic EL element, for example, the luminous efficiency of the organic EL element can be enhanced. In using for an organic thin-film solar cell, for another example, the power generation efficiency of the organic thin-film solar cell can be enhanced. Surface resistances in the present specification are values obtained by measuring with a four-terminal method.

On the other hand, the surface resistance of the second metal oxide layer 16 as a monolayer may be 200 Ω/sq. or higher, and it is preferable that the surface resistance of the second metal oxide layer 16 as a monolayer be 400 Ω/sq. or higher. The second metal oxide layer 16 having such relatively high surface resistance tends to have high work function. Accordingly, the transparent conductor 10 can be useful for organic devices.

The thickness of the second metal oxide layer 16 is preferably 2 nm or larger, more preferably 5 nm or larger, and even more preferably 10 nm or larger, to stably increase the work function of the surface 16a. To sufficiently increase the transparency and flexibility of the transparent conductor 10, on the other hand, the thickness of the second metal oxide layer 16 is, for example, 100 nm or smaller.

The thickness of each layer constituting the transparent conductor 10 can be measured by using the following procedure. The transparent conductor 10 is cut with a focused ion beam (FIB) apparatus to obtain a cross-section. The cross-section is observed under a transmission electron microscope (TEM) to measure the thickness of each layer. It is preferable to measure at 10 or more positions arbitrarily selected to determine the average value. A microtome, an apparatus other than focused ion beam apparatuses, may be used as a means to obtain a cross-section. A scanning electron microscope (SEM) may be used as a means to measure thickness. Alternatively, measurement of film thickness can be performed by using an X-ray fluorescence analyzer.

The thickness of the transparent conductor 10 may be 210 μm or smaller, or may be 200 μm or smaller. Such thickness can sufficiently meet the required level of transparency and flexibility.

The first metal oxide layer 12 and the third metal oxide layer 14 may be the same in terms of thickness, structure, and composition, or different in terms of at least one of thickness, structure, and composition. With the configuration such that the composition of the first metal oxide layer 12 and that of the third metal oxide layer 14 are different, the second metal oxide layer 16, the third metal oxide layer 14, and the metal layer 18 can be selectively removed by etching with acidic etching solution in one step, with the first metal oxide layer 12 left unetched.

The transparent conductor 10 having the above-described configuration is also superior in alkali resistance. Accordingly, patterning can be efficiently performed. The transparent conductor 10 can be suitably used for organic devices such as organic EL displays, organic EL lighting, and organic thin-film solar cells.

Modification of First Embodiment

The present modification has likewise the laminate structure illustrated in FIG. 1. The transparent substrate 11, the first metal oxide layer 12, the metal layer 18, and the third metal oxide layer 14 are the same as those in the above-described first embodiment. The second metal oxide layer 16 in the present modification is likewise a transparent layer containing a metal oxide, and contains ITO. When being positioned adjacent to an organic layer of an organic device, for example, the second metal oxide layer 16 exhibits a function to smooth the migration of holes. The second metal oxide layer 16 may contain ITO as a primary component, and may be composed of ITO and inevitable impurities derived from impurities or the like contained in the raw material. The second metal oxide layer 16 may contain another composite oxide. It is preferable that the content of ITO in the second metal oxide layer 16 be 90% by mass or more, and it is more preferable that the content of ITO in the second metal oxide layer 16 be 95% by mass or more.

In the present modification, in an X-ray photoelectron spectroscopy spectrum obtained through X-ray photoelectron spectroscopy for the surface 16a of the second metal oxide layer 16 opposite to the third metal oxide layer 14 side (metal layer 18 side), the ratio of peak area B in a binding energy region of 0.5 to 2.3 eV to peak area A in a binding energy region of 14 to 21 eV (B/A) is $1.0 \times 10^{-3}$ or lower. The surface 16a having such a ratio (B/A) has high work function.

The ratio of peak area B to peak area A (B/A) can be measured by using the following procedure. First, X-ray photoelectron spectroscopy is performed for the surface 16a by using a commercially available apparatus. Peak intensity is measured, for example, at intervals of 0.1 eV. The position of the carbon [C1s] peak is checked in the resulting X-ray photoelectron spectroscopy spectrum. Then, shift correction is performed to offset the X-ray photoelectron spectroscopy spectrum to fit the binding energy of the carbon [C1s] peak to 284.8 eV.

The average value of peak intensities in a binding energy region of 0 to 0.5 eV, regarded as background intensity, is subtracted from each peak intensity in a binding energy region of 0.5 to 2.3 eV (background correction). Peak area B is determined by integrating the peak intensities after the background correction.

A linear expression is determined by using the peak intensity at a binding energy of 14 eV as a start point and that at a binding energy of 21 eV as an end point. Intensity determined with this linear expression is regarded as background intensity. Intensity determined with the linear expression is subtracted from each peak intensity present in a binding energy region of 14 to 21 eV (background correction). Peak area A is determined by integrating the peak intensities after the background correction.

If background intensity is higher than peak intensity in a binding energy region and a negative value is given when the background intensity is subtracted from the peak intensity, the peak intensity in the binding energy region is regarded as 0. In the described manner, peak areas A and B are determined.

From peak area A and peak area B determined as described above, the ratio of peak area B to peak area A (B/A) is calculated. Peak area B is inferred to be related to electron density (distribution or probability) in a top portion of a valence band in an energy band diagram. If this peak area B is smaller, the electron density in the vicinity of the surface 16a is expected to be lower. In this case, the electron density of a top portion of the valence band is low and it follows that electrons are present at lower energy levels, and hence higher energy is needed to extract an electron. This results in achievement of higher work function of the surface 16a. The transparent conductor including the second metal oxide layer 16 having such high work function can smooth the migration of holes when an organic layer is laminated on the second metal oxide layer 16.

On the other hand, peak area A present in a binding energy region of 14 to 21 eV depends on the peak intensity of indium, [In4d], contained as a primary component in ITO. Hence, variation among measurement apparatuses, measurement conditions, and so on can be sufficiently reduced to enhance the precision by specifying, not only peak area B, as a ratio to peak area A (B/A).

The ratio (B/A) is preferably $8 \times 10^{-4}$ or lower, and more preferably $7 \times 10^{-4}$ or lower to further increase the work function of the surface 16a. The lower limit of the ratio (B/A) is, for example, $1 \times 10^{-6}$. It is preferred for enhanced precision to perform determination of an X-ray photoelectron spectroscopy spectrum twice or more and determine the average value.

It is preferable that the ratio of peak area B to peak area A in the inside of the second metal oxide layer 16 (hereinafter, referred to as "ratio (B/A)'") be higher than (B/A) in the surface of the second metal oxide layer 16. Specifically, it is preferable that the ratio (B/A)' exceed $8 \times 10^{-4}$. The inside mentioned here refers to a portion at or below a depth of 1.7 nm from the surface 16a. By virtue of the high ratio (BA)' in a portion at or below a depth of 1.7 nm from the surface 16a, work function can be increased as the position approaches the surface of the second metal oxide layer 16. The second metal oxide layer 16 as described can smooth the migration of holes when an organic layer is laminated thereon, and at the same time can sufficiently enhance the conductivity.

For peak area A and peak area B to calculate the ratio (B/A)', the surface 16a of the second metal oxide layer 16 is etched to expose the inside of the second metal oxide layer 16, and then the exposed surface is subjected to X-ray photoelectron spectroscopy to determine the X-ray photoelectron spectrum, from which peak area A and peak area B can be determined. The procedure to determine peak area A and peak area B from an X-ray photoelectron spectrum is the same as the procedure to determine peak area A and peak area B from an X-ray photoelectron spectrum for the surface 16a.

The value of the ratio (B/A) in the surface 16a of the second metal oxide layer 16 is inferred to depend on the electron density in the surface 16a. The electron density can be adjusted by changing the ratio of oxygen atoms in the surface 16a of the second metal oxide layer (ITO). In the case that the second metal oxide layer 16 is formed by DC magnetron sputtering with a target consisting of a sintered compact of ITO, for example, the ratio (B/A) in the surface 16a of the second metal oxide layer 16 can be adjusted by changing the ratio of oxygen gas to inert gas in sputtering. In addition, the difference between the ratio (B/A) in the surface 16a of the second metal oxide layer 16 and the ratio (B/A)' of the inside of the second metal oxide layer 16 may be increased by changing the ratio of oxygen gas to inert gas in the course of sputtering.

The surface 16a of the second metal oxide layer 16 having a ratio (B/A) of $1.0 \times 10^{-3}$ or lower has high work function. The work function of the surface 16a is preferably 4.5 eV or higher, more preferably a value over 4.7 eV, even more preferably 5.0 eV or higher, and particularly preferably 5.1 eV. If an organic layer is provided on the surface 16a of the second metal oxide layer 16 having such high work function to fabricate an organic device, injection of holes into the organic layer or reception of holes from the organic layer can be performed in a sufficiently smooth manner. Hence, the performance of the organic device can be enhanced. The work function of the surface 16a of the second metal oxide layer 16 can be measured by using any commercially available measurement apparatus.

When a mixed gas of inert gas and oxygen gas is used as gas for sputtering, the work function of the surface 16a of the second metal oxide layer 16 tends to increase as the flow rate ratio of oxygen gas to inert gas increases.

The surface resistance of the surface 16a of the second metal oxide layer 16 in the transparent conductor 10 is preferably 30 Ω/sq. or lower, and more preferably 25 Ω/sq. or lower. The transparent conductor 10 having such low surface resistance values can be suitably used for various applications. In using for an organic EL element, for example, the luminous efficiency of the organic EL element can be enhanced. In using for an organic thin-film solar cell, for another example, the power generation efficiency of the organic thin-film solar cell can be enhanced. Surface resistance values in the present specification are values obtained by measuring with a four-terminal method.

The thickness of the second metal oxide layer 16 is preferably 2 nm or larger, more preferably 5 nm or larger, and even more preferably 10 nm or larger, to stably increase the work function of the surface 16a. To sufficiently increase the transparency and flexibility of the transparent conductor 10, on the other hand, the thickness of the second metal oxide layer 16 is, for example, 100 nm or smaller.

The thickness of each layer constituting the transparent conductor 10 can be measured by using the following procedure. The transparent conductor 10 is cut with a focused ion beam (FIB) apparatus to obtain a cross-section. The cross-section is observed under a transmission electron microscope (TEM) to measure the thickness of each layer. It is preferable to measure at 10 or more positions arbitrarily selected to determine the average value. A microtome, an apparatus other than focused ion beam apparatuses, may be used as a means to obtain a cross-section. A scanning electron microscope (SEM) may be used as a means to measure thickness. Alternatively, measurement of film thickness can be performed by using an X-ray fluorescence analyzer.

The thickness of the transparent conductor 10 may be 210 µm or smaller, or may be 200 µm or smaller. Such thickness can sufficiently meet the required level of transparency and flexibility.

The first metal oxide layer 12 and the third metal oxide layer 14 may be the same in terms of thickness, structure, and composition, or different in terms of at least one of thickness, structure, and composition. With the configuration such that the composition of the first metal oxide layer 12 and that of the third metal oxide layer 14 are different, the second metal oxide layer 16, the third metal oxide layer 14, and the metal layer 18 can be selectively removed by etching with acidic etching solution in one step, with the first metal oxide layer 12 left unetched.

Also the transparent conductor 10 of the present modification can be suitably used for organic devices such as organic EL displays, organic EL lighting, and organic thin-film solar cells.

Second Embodiment

Figure 2:
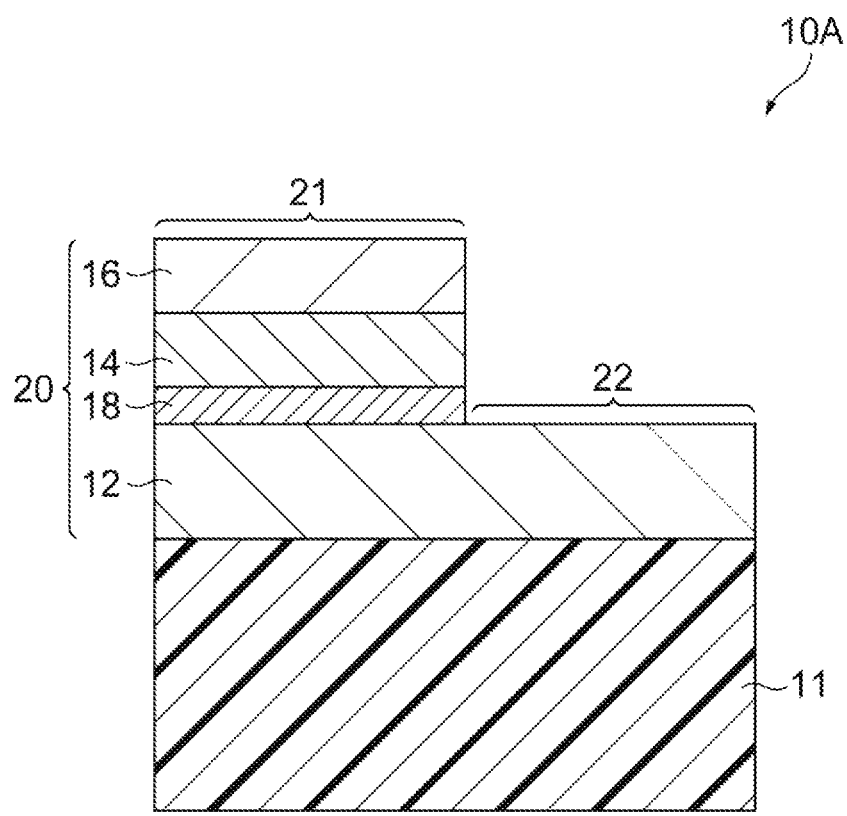
FIG. 2 shows a cross-sectional view schematically illustrating a second embodiment of the transparent conductor.

FIG. 2 shows a schematic cross-sectional view illustrating another embodiment of the transparent conductor. The transparent conductor 10A includes: a first laminated part 21 including a film-like transparent substrate 11, a first metal oxide layer 12, a metal layer 18, a third metal oxide layer 14, and a second metal oxide layer 16 in the order presented; and a second laminated part 22 including a transparent substrate 11 and a first metal oxide layer 12 in the order presented. The first laminated part 21 and the second laminated part 22 are provided to be adjacent to each other in the perpendicular direction (left-and-right direction in FIG. 2) to the direction of their lamination (up-and-down direction in FIG. 2). The first laminated part 21 and the second laminated part 22 may be alternately provided along the mentioned perpendicular direction.

The first laminated part 21 is a conductive part formed, for example, through a patterning process. The second laminated part 22 is a conductor-free insulating part formed, for example, through a patterning process. The transparent conductor 10A can be produced by performing patterning for the transparent conductor 10 in FIG. 1. An example of this production method will be described in the following.

A photoresist is applied to the surface of the second metal oxide layer 16 in the transparent conductor 10 in FIG. 1, and heated to form a resist film. The resist film is irradiated with an ultraviolet ray via a photomask with a predetermined pattern to expose a part of the resist film. Thereafter, the exposed part is removed by dissolving with a developer solution to expose a part of the surface of the second metal oxide layer 16 (positive).

The part of the second metal oxide layer 16 and the third metal oxide layer 14 and the metal layer 18 beneath the part are removed by dissolving with an acidic etching solution. The first metal oxide layer 12 beneath the metal layer 18 can be left unremoved by configuring the first metal oxide layer 12 to have a composition that does not allow dissolution in acidic etching solutions.

After the second metal oxide layer 16, the third metal oxide layer 14, and the metal layer 18 are dissolved to form the second laminated part 22, the resist film is removed. Thus, the transparent conductor 10A can be obtained. Although an example using a positive photoresist has been described for the above procedure, the procedure is not limited thereto, and a negative photoresist may be used.

The production method for the transparent conductor 10A, that is, the patterning method for the transparent conductor 10 is not limited to the above-described manner using a photoresist, and may be, for example, a printing method. In the case of a printing method, an ink is applied to a part of the surface of the second metal oxide layer 16 in the transparent conductor 10 in FIG. 1 in accordance with the shape of a pattern, for example, by using a method of inkjet printing, screen printing, or gravure printing. After printing, etching is performed for the part without the ink applied by using an acidic etching solution. Thereby, the second metal oxide layer 16, the third metal oxide layer 14, and the metal layer 18 are dissolved to form the second laminated part 22. Thereafter, the ink is removed, and thus the transparent conductor 10A is successfully obtained.

The transparent conductor 10 in FIG. 1 and the transparent conductor 10A in FIG. 2 may include any layer between any adjacent two layers. For example, a hardcoat layer may be included between the transparent substrate 11 and the first metal oxide layer 12, and an etching-resistant layer may be included between the metal layer 18 and the first metal oxide layer 12. A water vapor barrier layer may be included between the transparent substrate 11 and the transparent electrode 20. A pair of hardcoat layers may be provided to sandwich the transparent substrate 11. Another metal oxide layer having a composition different from that of the first metal oxide layer 12, or a metal nitride layer may be provided between the transparent substrate 11 and the first metal oxide layer 12.

The transparent conductors 10 and 10A are sufficiently superior in conductivity, flexibility, and corrosion resistance, and hence they can be suitably used for electrodes of organic devices such as organic EL displays, organic EL lighting, and organic thin-film solar cells. In this case, the first metal oxide layer 12, the metal layer 18, the third metal oxide layer 14, and the second metal oxide layer 16 function as a transparent electrode 20. The transparent electrode 20 may be an anode or a cathode.

Third Embodiment

Figure 3:
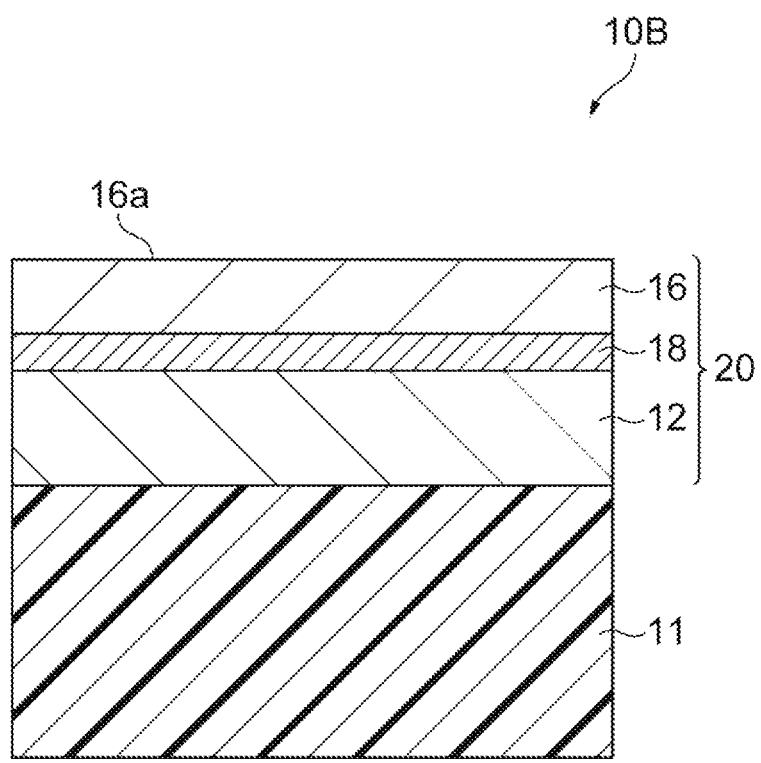
FIG. 3 shows a cross-sectional view schematically illustrating a third embodiment of the transparent conductor.

FIG. 3 shows a schematic cross-sectional view illustrating the third embodiment of the transparent conductor. The transparent conductor 10B includes a film-like transparent substrate 11, a first metal oxide layer 12, a metal layer 18, and a second metal oxide layer 16 in the order presented. That is, the transparent conductor 10B differs from the transparent conductor 10 of the above-described first embodiment in that the transparent conductor 10B does not include the third metal oxide layer 14. The configurations other than this are the same as those of the first embodiment.

The transparent conductor 10B includes the first metal oxide layer 12 composed of a metal oxide which is different from ITO. This configuration can prevent the corrosion of the metal layer 18 more reliably than transparent conductors having a configuration in which the metal layer 18 is sandwiched by ITO-containing metal oxide layers.

The work function of the surface 16a of the second metal oxide layer 16 is preferably 4.5 eV or higher, more preferably a value over 4.7 eV, even more preferably 5.0 eV or higher, and particularly preferably 5.1 eV. By setting such high work function, the transparent conductor 10B can be suitably used as a transparent conductor for organic devices.

The ratio (B/A) in the surface 16a of the second metal oxide layer 16 may be $1.0 \times 10^{-3}$ or lower, or $8 \times 10^{-4}$ or lower, or $7 \times 10^{-4}$ or lower. The lower limit of the ratio (B/A) may be, for example, $1 \times 10^{-6}$. Thereby, the work function can be increased, and the transparent conductor 10B can be suitably used as a transparent conductor for organic devices.

<Organic Device>

Figure 4:
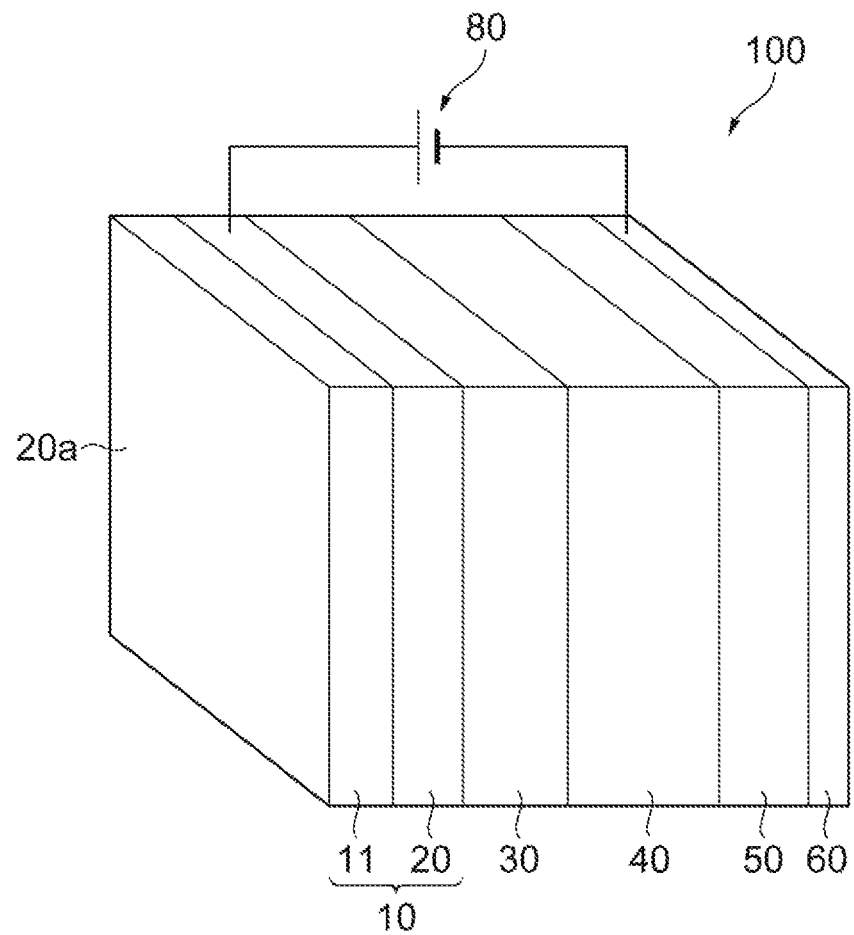
FIG. 4 shows a diagram schematically illustrating an embodiment of the organic device.

FIG. 4 shows a diagram schematically illustrating an embodiment of the organic device. The organic device 100 is, for example, organic EL lighting, and includes a laminate including a transparent substrate 11, a transparent electrode (anode) 20, a hole transport layer 30, a luminescent layer 40, an electron transport layer 50, and a metal electrode (cathode) 60 in the order presented. The transparent conductor 10 can be used as the transparent substrate 11 and transparent electrode 20 in the organic device 100.

The transparent conductor 10 is provided in such a manner that the surface of the second metal oxide layer 16 in the transparent electrode 20 (surface 16a in FIG. 1) contacts with the hole transport layer 30. A power source 80 is connected to the transparent electrode 20 that functions as an anode and the metal electrode 60 that functions as a cathode. Through application of an electric field by the power source 80, holes are injected from the transparent electrode 20 into the hole transport layer 30, and at the same time electrons are injected from the metal electrode 60 into the electron transport layer 50.

Holes injected into the hole transport layer 30 and electrons injected into the electron transport layer 50 recouple with each other in the luminescent layer 40. Through this recoupling, an organic compound in the luminescent layer 40 emits light. The light generated through this light emission passes through the hole transport layer 30, the transparent electrode 20, and the transparent substrate 11, and is radiated from a side surface 20a of the organic device 100.

The organic device 100 uses the transparent conductor 10 as the transparent substrate 11 and transparent electrode 20. Accordingly, holes can be efficiently injected from the transparent electrode 20 into the hole transport layer 30. Thus, the luminous efficiency of the organic device 100 can be increased. The luminous efficiency of the organic device 100 can be sufficiently increased by decreasing the carrier density of the second metal oxide layer 16 included in the transparent electrode 20, and by increasing the work function of the surface 16a of the second metal oxide layer 16.

Each of the hole transport layer 30, the luminescent layer 40, the electron transport layer 50, and the metal electrode (cathode) 60 can be formed with a common material. Examples of materials of the hole transport layer 30 include aromatic amine compounds. Examples of the luminescent layer 40 include ones with a two-component system including combination of a host material and a dopant material. Examples of the host material include 1,10-phenanthroline derivatives, organometal complex compounds, aromatic hydrocarbon compounds such as naphthalene, anthracene, naphthacene, perylene, benzofluoranthene, and naphthofluoranthene and derivatives thereof, and styrylamine and tetraaryldiamine derivatives. Examples of the dopant material include benzodifluoranthene derivatives and coumarin derivatives.

The electron transport layer 50 may be formed with an organic material such as a compound having a trinitrofluorenone, oxadiazole, or triazole structure, and may be formed by using an inorganic material such as alkali metal such as lithium, lithium fluoride, and lithium oxide. For the metal electrode 60, a metal electrode composed of a metal material such as aluminum, an organometal complex, or a metal compound can be used. Each layer can be formed by using a common method such as a vacuum deposition method, an ionization deposition method, and a coating method.

Although embodiments of the present disclosure have been described hereinabove, the present disclosure is not limited to the above-described embodiments. For example, the organic device in FIG. 4 may include the transparent conductor 10A or the transparent conductor 10B, in place of the transparent conductor 10. The organic device is not limited to organic EL lighting as illustrated in FIG. 4, and may be, for example, an organic EL display or an organic thin-film solar cell.

EXAMPLES

Hereinafter, the present disclosure will be more specifically described with reference to Examples and Comparative Examples;

however, the present disclosure is not limited to these Examples.

Example 1

(Fabrication of Transparent Conductor)

A transparent conductor having a laminate structure as illustrated in FIG. 1 was fabricated. The transparent conductor had a laminate structure in which a transparent substrate, a first metal oxide layer, a metal layer, a third metal oxide layer, and a second metal oxide layer were laminated in the order presented. This transparent conductor was fabricated in the following manner.

A commercially available polyethylene terephthalate film (thickness: 125 μm) was prepared. This PET film was used as a transparent substrate. Above the transparent substrate, a first metal oxide layer, a metal layer, a third metal oxide layer, and a second metal oxide layer were sequentially formed by DC magnetron sputtering.

A first metal oxide layer (thickness: 40 nm) was formed on the transparent substrate under reduced pressure (0.5 Pa) in a mixed gas atmosphere of argon gas and oxygen gas through DC magnetron sputtering using a target composed of three components of zinc oxide, indium oxide, and titanium oxide. As zinc oxide, indium oxide, and titanium oxide in the first metal oxide layer were converted into ZnO, $In_2O_3$, and $TiO_2$, respectively, the content of ZnO was 74 mol %, the content of $In_2O_3$ was 15 mol %, and the content of $TiO_2$ was 11 mol %, to the total of the three components.

A metal layer (thickness: 10 nm) was formed on the first metal oxide layer under reduced pressure (0.5 Pa) in an argon gas atmosphere through DC magnetron sputtering using a target composed of a silver alloy consisting of Ag, Pd, and Cu. The mass ratio of the metals in the silver alloy constituting the metal layer was Ag:Pd:Cu=99.0:0.7:0.3.

A third metal oxide layer (thickness: 20 nm) was &tined on the metal layer under reduced pressure (0.5 Pa) in a mixed gas atmosphere of argon gas and oxygen gas through DC magnetron sputtering using a target composed of four components of zinc oxide, indium oxide, titanium oxide, and tin oxide. As zinc oxide, indium oxide, titanium oxide, and tin oxide in the third metal oxide layer were converted into ZnO, $In_2O_3$, $TiO_2$, and $SnO_2$, respectively, the content of ZnO was 35 mol %, the content of $In_2O_3$ was 29 mol %, the content of $TiO_2$ was 14 mol %, and the content of $SnO_2$ was 22 mol %, to the total of the four components.

A second metal oxide layer (thickness: 20 nm, ITO layer) was formed on the third metal oxide layer under reduced pressure (0.5 Pa) in a mixed gas atmosphere of argon gas and oxygen gas through DC magnetron sputtering using a target composed of ITO. The flow rate ratio of oxygen gas to argon gas in DC magnetron sputtering was 1.1% by volume. This flow rate ratio is a ratio in normal state (25° C., 1 bar), and the same is applied to each of Examples and Comparative Examples below.

(Evaluation of Transparent Conductor)

The total light transmittance (transmittance) of the transparent conductor fabricated was measured by using a haze meter (product name: NDH-7000, produced by NIPPON DENSHOKU INDUSTRIES CO., LTD.). Measurement results of 85% or higher were rated as "A", and those of lower than 85% were rated as "B". The results are shown in the column "Transmittance" in Table 1.

The surface resistance value of the transparent conductor fabricated opposite to the transparent substrate side was measured by using a four-terminal resistivity meter (product name: Loresta GP, produced by Mitsubishi Chemical Corporation). Measurement results of 30 Ω/sq. or lower were rated as "A", and those of over 30 Ω/sq. were rated as "B". The results are shown in the column "Surface resistance value" in Table 1.

The work function of the surface of the second metal oxide layer in the transparent conductor fabricated was measured by using a photoelectron spectrometer (produced by RIKEN KEIKI Co., Ltd., product name: FAC-1). The results are shown in the column "Work function" in Table 1.

The flexibility of the transparent conductor fabricated was evaluated in the following procedure. A mandrel with a diameter of 5 mm was wrapped with the transparent conductor to bend the transparent conductor at an angle of 180°. After the mandrel was wrapped once, the above-described measurement of the surface resistance value was performed. Cases that no difference was found between the surface resistance value before wrapping the mandrel and that after wrapping the mandrel were rated as "A", and cases that a difference was found were rated as "B". Cases that such a difference was within the measurement error range of the four-terminal resistivity meter were rated as "A". The results are shown in the column "Flexibility" in Table 1. Numerical values in the column are surface resistance values after wrapping.

The corrosion resistance of the transparent conductor fabricated was evaluated in the following procedure. The transparent conductor was stored under a high-temperature/high-humidity environment of 60° C. and 90% RH for 240 hours. Cases that no discoloration was found thereafter by visual observation were rated as "A". Cases that a minute discolored region (about 1 mm² or smaller) was found were rated as "B", and cases that a discolored region larger than those in cases of "B" was found were rated as "C". The results are shown in the column "Corrosion resistance" in Table 1.

Example 2

A transparent conductor was fabricated and evaluated under the same conditions as in Example 1, except that the flow rate ratio of oxygen gas to argon gas in forming the second metal oxide layer by DC magnetron sputtering was changed to 1.7% by volume. The results of evaluations were as shown in Table 1.

Example 3

A transparent conductor was fabricated and evaluated under the same conditions as in Example 1, except that the flow rate ratio of oxygen gas to argon gas in forming the second metal oxide layer by DC magnetron sputtering was changed to 2.4% by volume. The results of evaluations were as shown in Table 1.

Example 4

A transparent conductor was fabricated and evaluated under the same conditions as in Example 1, except that the flow rate ratio of oxygen gas to argon gas in forming the second metal oxide layer by DC magnetron sputtering was changed to 3.0% by volume. The results of evaluations were as shown in Table 1.

Example 5

A transparent conductor was fabricated and evaluated under the same conditions as in Example 1, except that the flow rate ratio of oxygen gas to argon gas in forming the second metal oxide layer by DC magnetron sputtering was changed to 4.3% by volume. The results of evaluations were as shown in Table 1.

Example 6

A transparent conductor was fabricated in the same manner as in Example 4, except that the third metal oxide layer was not provided and the thickness of the second metal oxide layer (ITO layer) was changed to 40 nm. That is, this transparent conductor included the transparent substrate, the first metal oxide layer, the metal layer, and the second metal oxide layer in the order presented. Evaluation of this transparent conductor was performed in the same manner as in Example 1. The results were as shown in Table 3.

TABLE 1

|  | Transmittance (%) | Surface resistance value (Ω/sq.) | Work function (eV) | Flexibility (Ω/sq.) | Corrosion resistance |
| --- | --- | --- | --- | --- | --- |
| Example 1 | A (88.7) | A (8.8) | 4.6 | A (8.8) | A |
| Example 2 | A (88.3) | A (8.6) | 4.8 | A (8.6) | A |
| Example 3 | A (88.6) | A (8.7) | 5.0 | A (8.7) | A |
| Example 4 | A (88.8) | A (8.9) | 5.1 | A (8.9) | A |
| Example 5 | A (88.4) | A (8.8) | 5.2 | A (8.8) | A |
| Example 6 | A (88.5) | A (8.5) | 5.1 | A (8.5) | B |

In Table 1, numerical values in parentheses in the columns "Transmittance", "Surface resistance value", and "Flexibility" represent measurements. As shown in Table 1, it was confirmed that work function tended to increase as the ratio of oxygen gas in forming the second metal oxide layer increased. The transparent conductors in Examples 1 to 6 each exhibited a surface resistance value of 9 Ω/sq. or lower, and were thus confirmed to be superior in conductivity. In addition, the transparent conductors in Examples 1 to 6 were confirmed to be superior in flexibility and corrosion resistance. Among them, the transparent conductors in Examples 1 to 5 were confirmed to be sufficiently superior in corrosion resistance.

(Evaluation of Element Properties of Organic Device)

Under the same conditions as in Examples 1 to 5 except that a glass substrate was used as a transparent substrate in place of the PET film, a first metal oxide layer, a metal layer, a third metal oxide layer, and a second metal oxide layer were sequentially formed above the transparent substrate to afford transparent conductors. A hole transport layer (thickness: 50 nm), a luminescent layer containing tris(8-quinolinolato)aluminum (thickness: 50 nm), an electron transport layer containing LiF (thickness: 12 nm), and an aluminum electrode (300 nm) were each formed above the surface of the second metal oxide layer in each transparent conductor by vapor deposition, to afford organic EL light-emitting elements as illustrated in FIG. 4.

Figure 5:
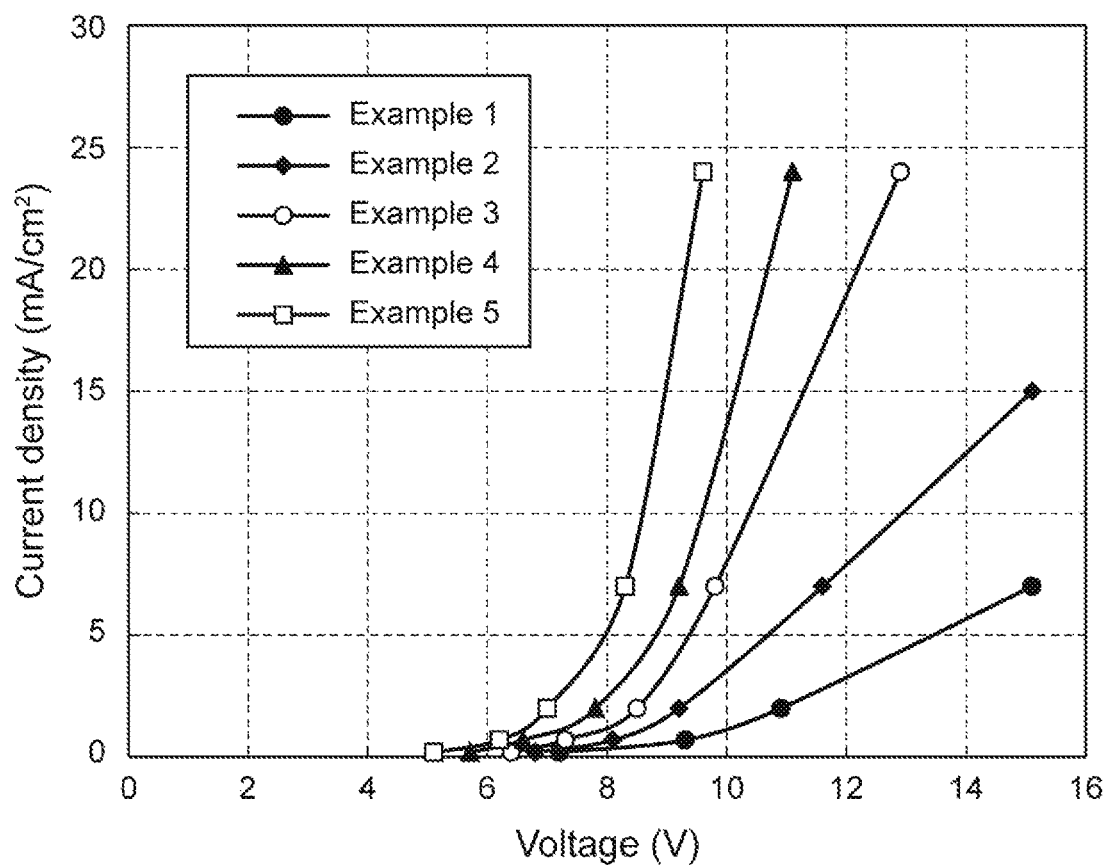
FIG. 5 shows a graph representing element properties of the organic device.

Voltage values when a current was sent to each of the organic EL light-emitting elements obtained were measured. The results were as shown in FIG. 5. FIG. 5 demonstrates that ability of hole injection from the transparent conductor into the organic layer is higher as current density (a current value per unit area) is higher at the same voltage value. That is, the organic EL light-emitting elements can be driven at a lower voltage as current density is higher.

Current densities at a voltage of 10 V are shown in Table 2. From FIG. 5 and Table 2, it was confirmed that current density increases and ability of hole injection is higher as work function is higher. Current density of 5 mA/cm² or higher was obtained at a voltage of 10 V or lower when work function was 5.0 eV or higher, and thus it was confirmed that sufficiently superior element properties can be obtained.

TABLE 2

|  | Work function (eV) | Current density (mA/cm²) |
| --- | --- | --- |
| Example 1 | 4.6 | 1.0 |
| Example 2 | 4.8 | 3.5 |
| Example 3 | 5.0 | 8.0 |
| Example 4 | 5.1 | 13.5 |
| Example 5 | 5.2 | >25 |

Reference Example 1

A second metal oxide layer (ITO monolayer) was foiled on the commercially available polyethylene terephthalate film used in Example 1 in the same procedure as in Example 1. The surface resistance value and work function of this ITO monolayer were measured in the same manner as in Example 1. The specific resistance value of the ITO monolayer was determined from the product of the surface resistance value and the thickness of the ITO monolayer. Further, the carrier density of the ITO monolayer was measured by using a Hall effect measurement apparatus (produced by ECOPIA, product name: HMS-3000). The results were as shown in Table 3.

Reference Example 2

A second metal oxide layer (ITO monolayer) was formed on the commercially available polyethylene terephthalate film used in Example 2 in the same procedure as in Example 2. The surface resistance value and work function of this ITO monolayer were measured in the same manner as in Example 1. The specific resistance value and carrier density of the ITO monolayer were measured in the same manner as in Reference Example 1. The results were as shown in Table 3.

Reference Example 3

A second metal oxide layer (ITO monolayer) was formed on the commercially available polyethylene terephthalate film used in Example 3 in the same procedure as in Example 3. The surface resistance value and work function of this ITO monolayer were measured in the same manner as in Example 1. The specific resistance value and carrier density of the ITO monolayer were measured in the same manner as in Reference Example 1. The results were as shown in Table 3.

Reference Example 4

A second metal oxide layer (ITO monolayer) was formed on the commercially available polyethylene terephthalate film used in Example 4 in the same procedure as in Example 4. The surface resistance value and work function of this ITO monolayer were measured in the same manner as in Example 1. The specific resistance value and carrier density of the ITO monolayer were measured in the same manner as in Reference Example 1. The results were as shown in Table 3.

Reference Example 5

A second metal oxide layer (ITO monolayer) was formed on the commercially available polyethylene terephthalate film used in Example 5 in the same procedure as in Example 5. The surface resistance value and work function of this ITO monolayer were measured in the same manner as in Example 1. The specific resistance value and carrier density of the ITO monolayer were measured in the same manner as in Reference Example 1. The measurement results were as shown in Table 3.

The work functions in Reference Examples 1 to 5 in Table 3 were equal to the work functions in Examples 1 to 5 in Table 1. It was confirmed from this that work function is not affected by the compositions of inner layers and is a property determined by the second metal oxide layer. In addition, it was confirmed that the surface resistance value and specific resistance value of the second metal oxide layer are affected by the ratio of oxygen gas in forming the second metal oxide layer. This suggests that change in the ratio of oxygen gas in forming the second metal oxide layer results in change in the structure of the second metal oxide layer. Moreover, Table 3 shows that carrier density decreases to give a deteriorated surface resistance value as work function increases, suggesting that it is difficult for transparent conductor films composed of an ITO monolayer to achieve high work function and low resistance in combination.

Figure 6:
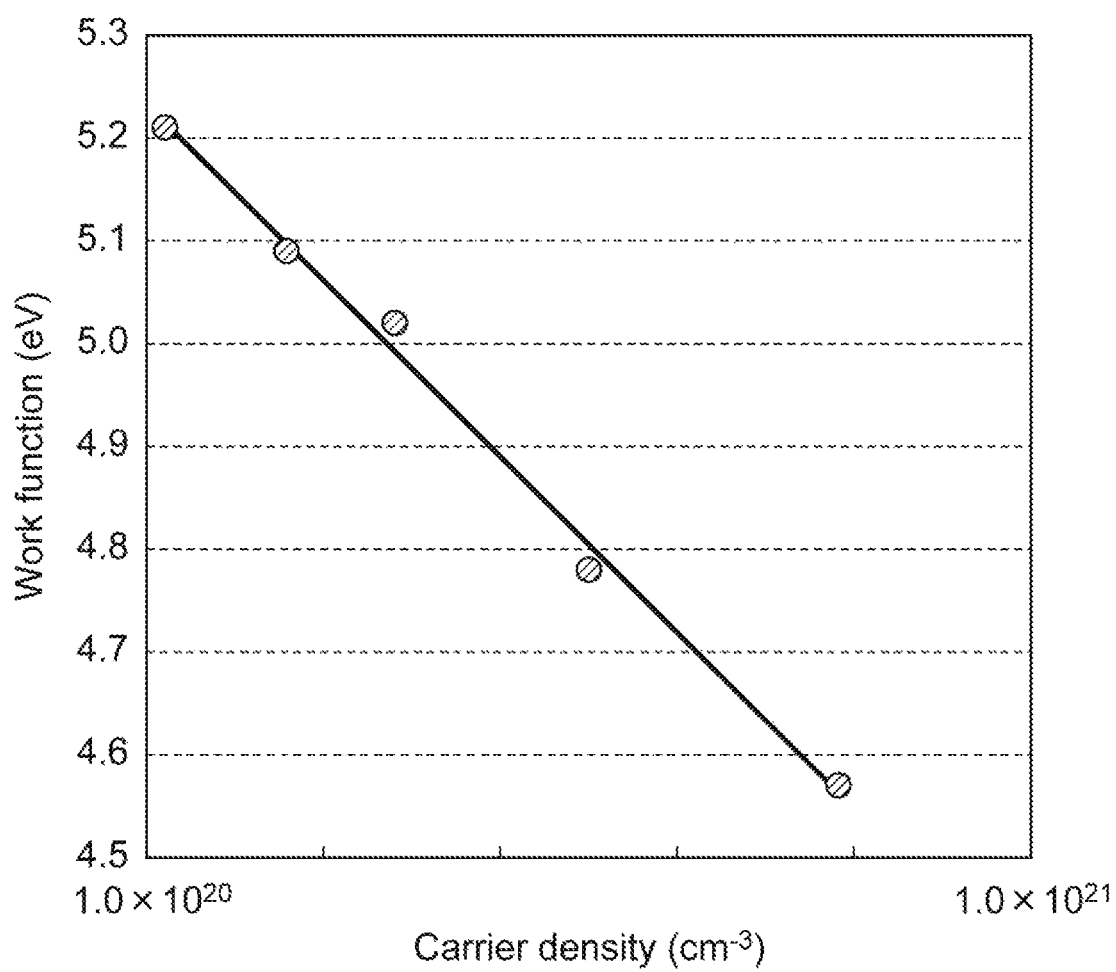
FIG. 6 shows a graph representing an example of the relation between carrier density and work function.

FIG. 6 shows a graph representing the relation between carrier density and work function for the ITO monolayers in Reference Examples 1 to 5. It was continued that carrier density and work function are almost proportional to each other, and work function increases as carrier density decreases. When carrier density [$cm^{-3}$] and work function [eV] were denoted as x and y, respectively, the correlation equation thereof was $y=-9\times10^{-22}x+5.3269$, and the correlational coefficient ($r^2$) was 0.9943. In order to set work function to 5.0 eV or higher, it is needed to set carrier density to $3.5\times10^{20}$ $cm^{-3}$ or lower.

Comparative Example 1

An ITO layer (thickness: 40 nm) was formed on the commercially available polyethylene terephthalate film used in Example 1 under the same conditions as in forming the second metal oxide layer in Example 4 (flow rate ratio of oxygen gas to argon gas: 3.0% by volume). Thus, a transparent conductor consisting of the transparent substrate and the ITO layer was obtained. Evaluation of this transparent conductor was performed in the same manner as in Example 1. The results were as shown in Table 4.

Comparative Example 2

An ITO layer (thickness: 150 nm) was formed on the commercially available polyethylene terephthalate film used in Example 1 under the same conditions as in forming the second metal oxide layer in Example 4 (flow rate ratio of oxygen gas to argon gas: 3.0% by volume). Thus, a transparent conductor consisting of the transparent substrate and the ITO layer was obtained. Evaluation of this transparent conductor was performed in the same manner as in Example 1. The results were as shown in Table 4.

Comparative Example 3

An ITO layer (thickness: 40 nm) was formed on the commercially available polyethylene terephthalate film used in Example 1 under the same conditions as in forming the second metal oxide layer in Example 4 (flow rate ratio of oxygen gas to argon gas: 3.0% by volume). On this ITO layer, a metal layer identical to that in Example 1 was formed. On this metal layer, an ITO layer (thickness: 40 nm) was further formed under the same conditions as in forming the second metal oxide layer in Example 4 (flow rate ratio of oxygen gas to argon gas: 3.0% by volume). Thus, a transparent conductor including the transparent substrate, ITO layer, metal layer, and ITO layer laminated in the order presented was obtained. Evaluation of this transparent conductor was performed in the same manner as in Example 1. The results were as shown in Table 4.

TABLE 3

| | Surface resistance value ($\Omega$/sq.) | Specific resistance value ($\Omega \cdot cm$) | Work function (eV) | Hall measurement ($cm^{-3}$) |
|---|---|---|---|---|
| Reference Example 1 | 270 | $5.4 \times 10^{-4}$ | 4.6 | $8.0 \times 10^{20}$ |
| Reference Example 2 | 190 | $3.8 \times 10^{-4}$ | 4.8 | $5.5 \times 10^{20}$ |
| Reference Example 3 | 250 | $5.0 \times 10^{-4}$ | 5.0 | $3.5 \times 10^{20}$ |
| Reference Example 4 | 430 | $8.6 \times 10^{-4}$ | 5.1 | $2.4 \times 10^{20}$ |
| Reference Example 5 | 1350 | $2.7 \times 10^{-3}$ | 5.2 | $1.2 \times 10^{20}$ |

Comparative Example 4

The procedures in Comparative Example 3 before and including forming a metal layer were performed. On the metal layer, a metal oxide layer (thickness: 40 nm) containing four components of zinc oxide, indium oxide, titanium oxide, and tin oxide was formed. This metal oxide layer was formed with the same method as for the third metal oxide layer in Example 1. Accordingly, this transparent conductor included the transparent substrate, ITO layer, metal layer, and metal oxide layer (corresponding to the third metal oxide layer in Example 1) in the order presented. Evaluation of this transparent conductor was performed in the same manner as in Example 1. The results were as shown in Table 4.

TABLE 4

| | Transmittance (%) | Surface resistance value (Ω/sq.) | Work function (eV) | Flexibility (Ω/sq.) | Corrosion resistance |
|---|---|---|---|---|---|
| Comparative Example 1 | B (83.4) | B (40) | 5.1 | A (40) | A |
| Comparative Example 2 | A (86.0) | A (13) | 5.1 | B (unmeasurable) | A |
| Comparative Example 3 | A (88.1) | A (8.7) | 5.1 | A (8.7) | C |
| Comparative Example 4 | A (88.1) | A (8.5) | 4.4 | A (8.5) | B |

In Table 4, numerical values in parentheses in the columns "Transmittance", "Surface resistance value", and "Flexibility" represent measurements. As shown in Table 4, at least one of rating results for conductivity, flexibility, and corrosion resistance was "B" for the transparent conductors in Comparative Examples 1 to 4. The surface resistance value in Comparative Example 1 was higher than that in any Example. The surface resistance value was successfully decreased by the increased thickness of the ITO layer in Comparative Example 2; however, the ITO layer was cracked in evaluation of flexibility to become an insulating film. The corrosion resistances in Comparative Examples 3 and 4 were poor as compared to those in Examples 1 to 5, because the ITO layer and the metal layer were contacting with each other.

Examples 7 to 10

Transparent conductors were fabricated and evaluated in the same manner as in Example 4, except that the thickness of the second metal oxide layer was changed as shown in Table 5 and accordingly the thickness of the third metal oxide layer was changed to set the total thickness of the second metal oxide layer and the third metal oxide layer to 40 nm. The results are shown in Table 5.

TABLE 5

| | Thickness of second metal oxide layer (nm) | Transmittance (%) | Surface resistance value (Ω/sq.) | Work function (eV) | Flexibility (Ω/sq.) | Corrosion resistance |
|---|---|---|---|---|---|---|
| Example 7 | 2 | A (88.3) | A (8.9) | 5.1 | A (8.9) | A |
| Example 8 | 5 | A (88.7) | A (8.9) | 5.1 | A (8.9) | A |
| Example 9 | 10 | A (88.8) | A (8.9) | 5.1 | A (8.9) | A |
| Example 10 | 15 | A (88.4) | A (8.9) | 5.1 | A (8.9) | A |

In Table 5, numerical values in parentheses represent measurements. As shown in Table 5, it was confirmed that the transparent conductors in Examples 7 to 10 were superior in conductivity, flexibility, and corrosion resistance. In addition, it was confirmed that work function hardly depends on the thickness of the third metal oxide layer.

Example 11

A first metal oxide layer, a metal layer, and a third metal oxide layer were formed above a transparent substrate in the order presented in the same procedure as in Example 1. Subsequently, a second metal oxide layer (thickness: 20 nm, ITO layer) was formed on the third metal oxide layer under reduced pressure (0.5 Pa) in a mixed gas atmosphere of argon gas and oxygen gas through DC magnetron sputtering using a target composed of ITO. The flow rate ratio of oxygen gas to argon gas in DC magnetron sputtering was approximately 6.5% by volume. Thus, a transparent conductor of Example 11 was obtained.

Example 12

A transparent conductor was fabricated under the same conditions as in Example 11, except that the flow rate ratio of oxygen gas to argon gas in forming the second metal oxide layer by DC magnetron sputtering was changed to approximately 2.2% by volume.

Comparative Example 5

A transparent conductor was fabricated under the same conditions as in Example 1, except that the flow rate ratio of oxygen gas to argon gas in forming the second metal oxide layer by DC magnetron sputtering was changed to 0% by volume.

(XPS Measurement)

X-ray photoelectron spectroscopy was performed for the surface of the second metal oxide layer in each of Example 11, Example 12, and Comparative Example 5 by using a commercially available apparatus (produced by ULVAC-PHI, Inc., product name: QUANTERA II). After this analysis, the surface of the second metal oxide layer was subjected to sputter etching by irradiating with an Ar ion beam in a raster scanning mode to remove a part from the surface of the second metal oxide layer to a depth of 1.7 nm. X-ray photoelectron spectroscopy was performed for the inside of the second metal oxide layer exposed through such Ar ion etching in the same manner as in the analysis of the surface.

Figure 7:
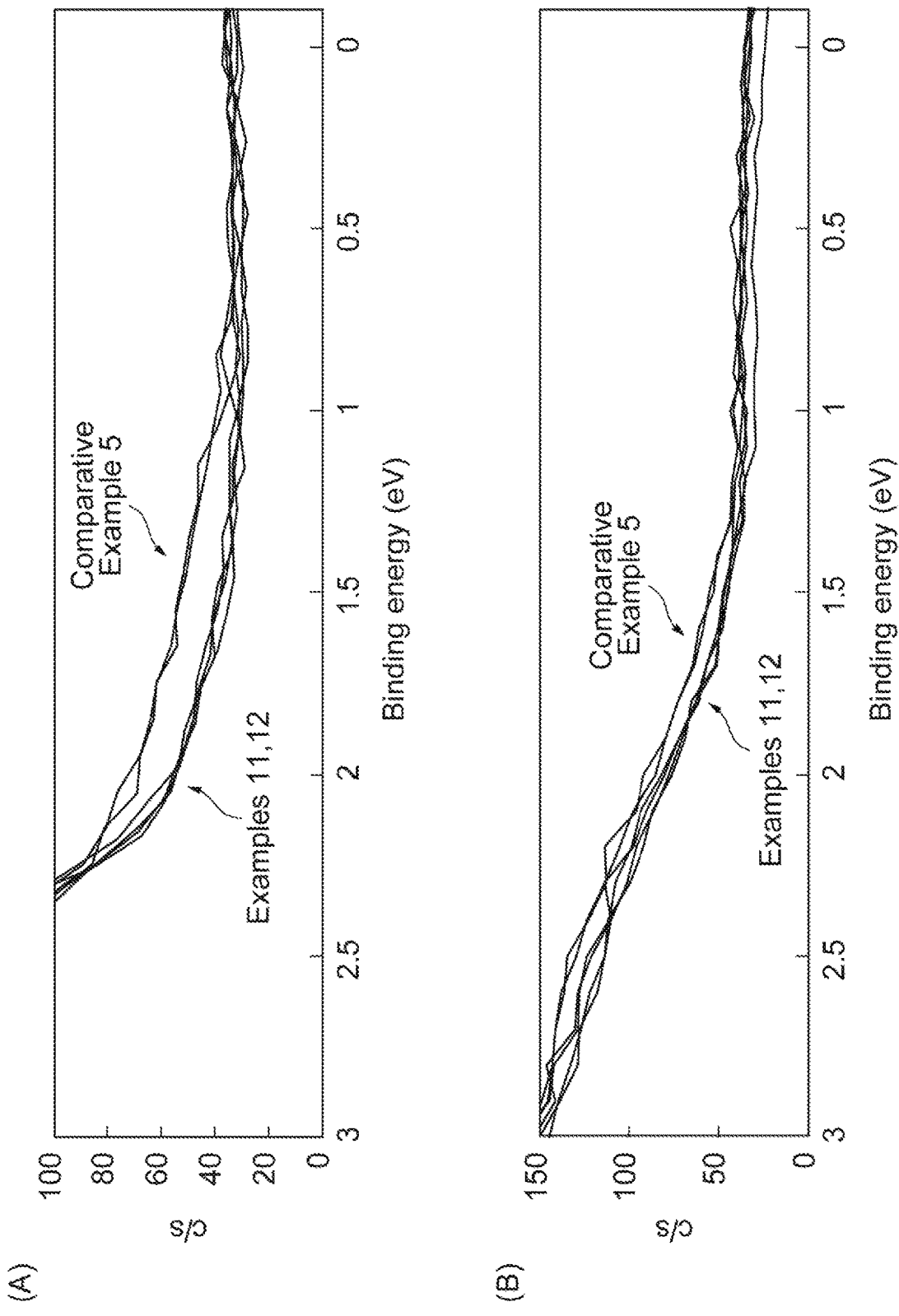
FIG. 7(A) shows X-ray photoelectron spectroscopy spectra including a binding energy region of 0.5 to 2.3 eV for the surface (before Ar ion etching) of the second metal oxide layer in Example 11, Example 12, and Comparative Example 5.
FIG. 7(B) shows X-ray photoelectron spectroscopy spectra including a binding energy region of 0.5 to 2.3 eV for the inside (exposed surface after Ar ion etching) of the second metal oxide layer in Example 11, Example 12, and Comparative Example 5.

FIGS. 7(A), 8, 9, 10(A), and 11 show X-ray photoelectron spectroscopy spectra for Example 11, Example 12, and Comparative Example 5 before Ar ion etching. FIG. 7(A) shows X-ray photoelectron spectroscopy spectra including a binding energy region of 0.5 to 2.3 eV determined for the surface of the second metal oxide layer in Example 11, Example 12, and Comparative Example 5. In FIGS. 7 to 11, two spectra are shown for each of Example 11, Example 12, and Comparative Example 5 because measurement was performed twice for each Example and Comparative Example. As shown in FIG. 7(A), the spectra for Example 11 and 12 were different in shape from those for Comparative Example 5.

Figure 8:
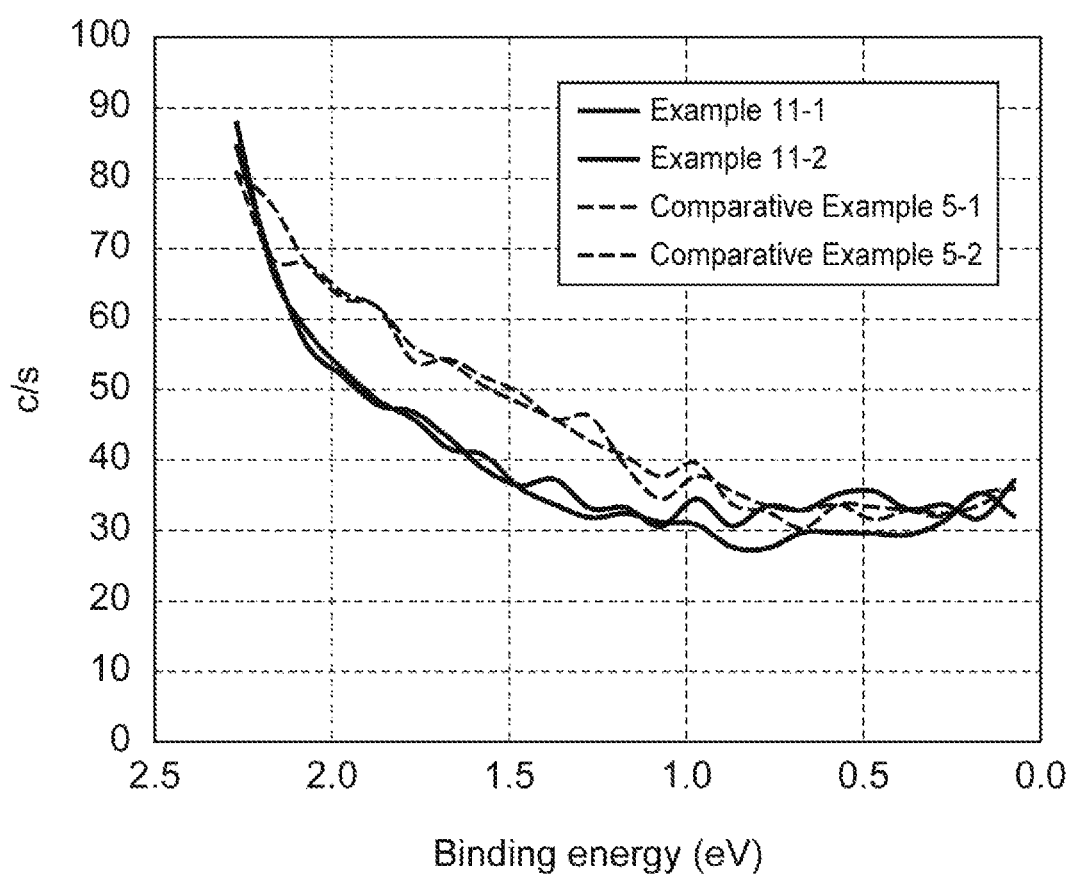
FIG. 8 shows an enlarged view of X-ray photoelectron spectroscopy spectra including a binding energy region of 0.5 to 2.3 eV for the surface (before Ar ion etching) of the second metal oxide layer in Example 11 and Comparative Example 5.
Figure 9:
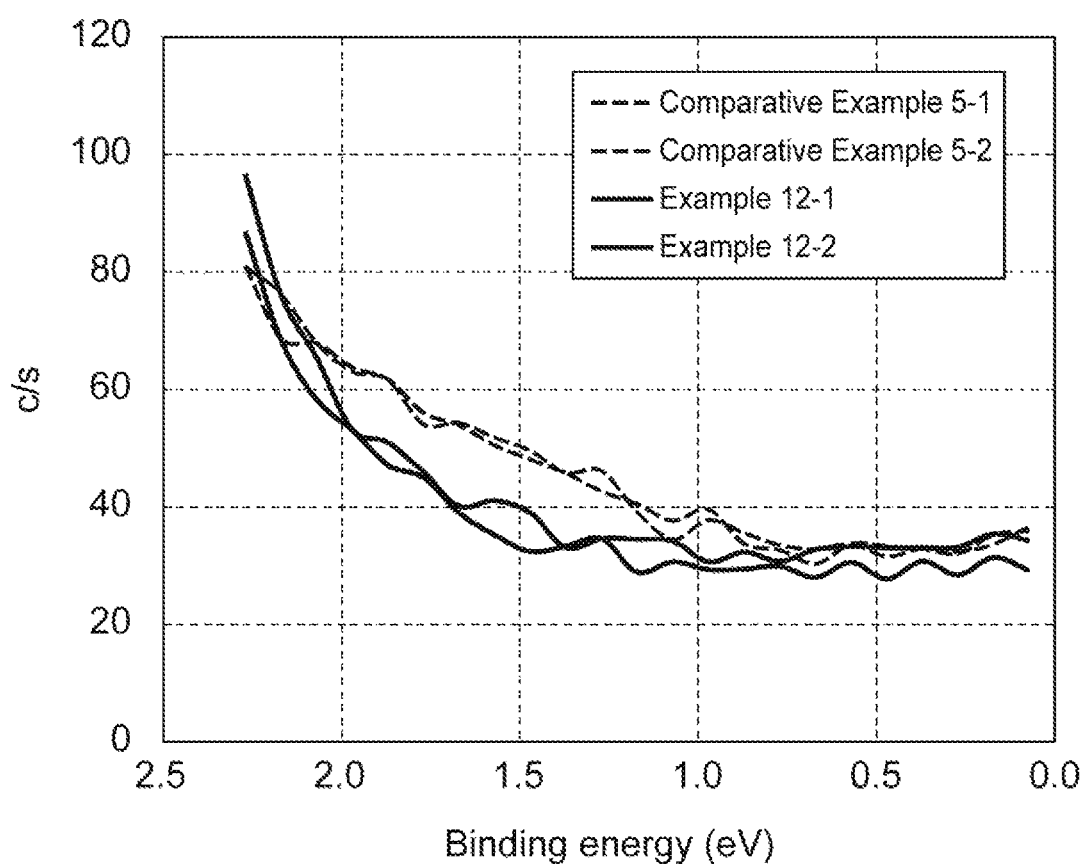
FIG. 9 shows an enlarged view of X-ray photoelectron spectroscopy spectra including a binding energy region of 0.5 to 2.3 eV for the surface (before Ar ion etching) of the second metal oxide layer in Example 12 and Comparative Example 5.
Figure 10:
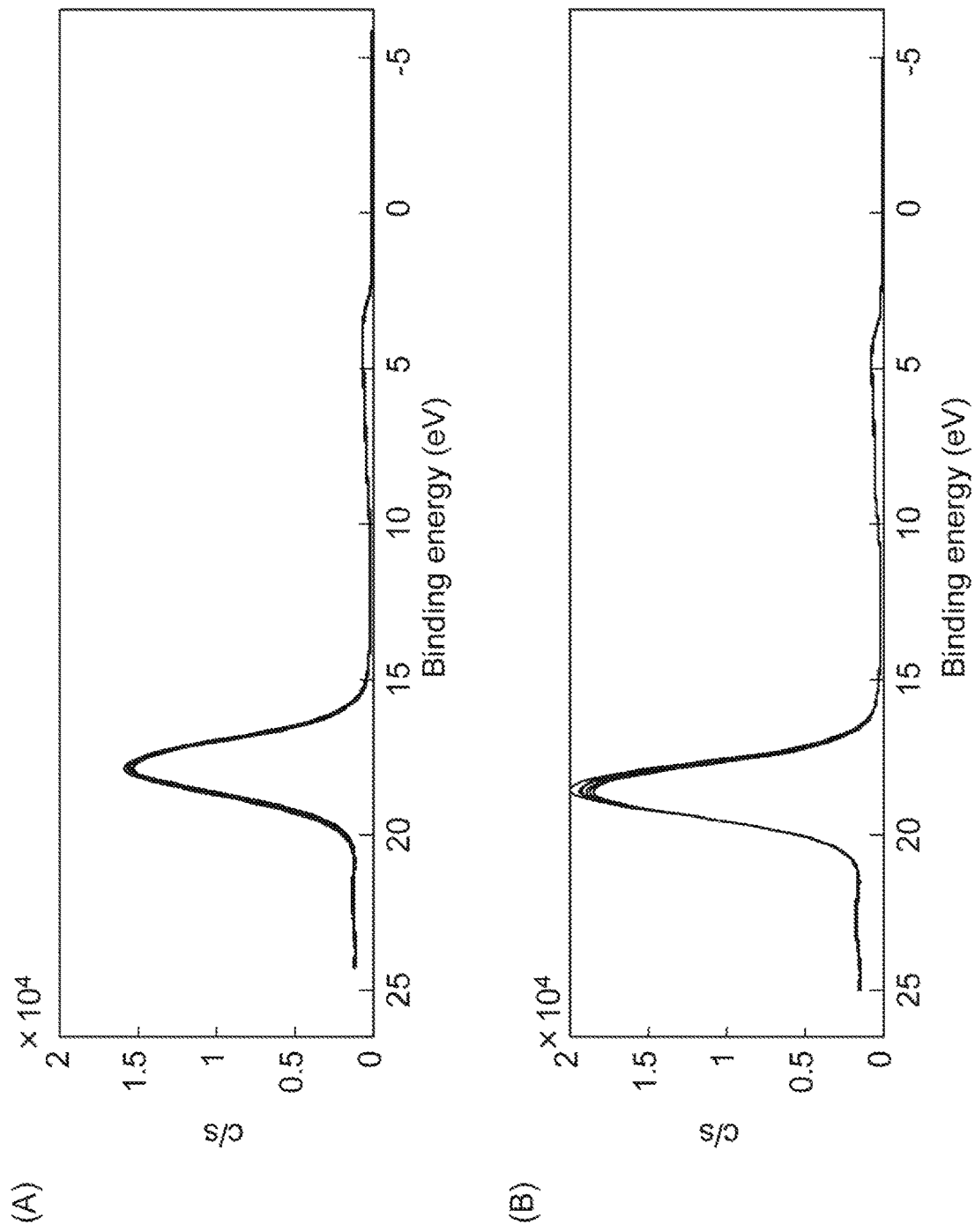
FIG. 10(A) shows X-ray photoelectron spectroscopy spectra including a binding energy region of 14 to 21 eV for the surface (before Ar ion etching) of the second metal oxide layer in Example 11, Example 12, and Comparative Example 5.
FIG. 10(B) shows X-ray photoelectron spectroscopy spectra including a binding energy region of 14 to 21 eV for the inside (exposed surface after Ar ion etching) of the second metal oxide layer in Example 11, Example 12, and Comparative Example 5.

FIG. 8 shows an enlarged view of X-ray photoelectron spectroscopy spectra including a binding energy region of 0.5 to 2.3 eV for the surface of the second metal oxide layer in Example 11 and Comparative Example 5 before Ar ion etching. FIG. 9 shows an enlarged view of X-ray photoelectron spectroscopy spectra including a binding energy region of 0.5 to 2.3 eV for the surface of the second metal oxide layer in Example 12 and Comparative Example 5 before Ar ion etching. In FIG. 8, two X-ray photoelectron spectroscopy spectra for Example 11 are shown as those for Example 11-1 and Example 11-2. In FIG. 9, two X-ray photoelectron spectroscopy spectra for Example 12 are shown as those for Example 12-1 and Example 12-2. Similarly, two spectra for Comparative Example 5 are shown as those for Comparative Example 5-1 and Comparative Example 5-2 in FIGS. 8 and 9. As shown in FIGS. 7(A), 8, and 9, the spectra for Example 11 and Example 12 were found to shift to the lower side as compared with those for Comparative Example 5.

FIG. 10(A) shows X-ray photoelectron spectroscopy spectra including a binding energy region of 14 to 21 eV for the surface of the second metal oxide layer in Example 11, Example 12, and Comparative Example 5 before Ar ion etching. This binding energy region includes a peak of indium [In4d]. This peak was observed almost at the same position (the same binding energy) in X-ray photoelectron spectroscopy spectra for Example 11, Example 12, and Comparative Example 5.

region of 14 to 21 eV and peak area B in a binding energy region of 0.5 to 2.3 eV were calculated. Before calculation of peak areas A and B, the above-described shift correction and background correction were performed. The values of peak areas A and B and the ratios (B/A) were as shown in Table 6. Since X-ray photoelectron spectroscopy was performed twice for each of Examples 11 and 12 and Comparative Example 5, ratios (B/A) are each shown as an average value of two measurements in Table 6.

FIGS. 7(B) and 10(B) show X-ray photoelectron spectroscopy spectra for the exposed surface of the second metal oxide layer in Example 11, Example 12, and Comparative Example 5 after Ar ion etching. Comparison between FIG. 7(A) and FIG. 7(B) shows that the X-ray photoelectron spectroscopy spectra for the surface of the second metal oxide layer and those for the inside thereof are different. This indicates that the surface states of the two are different. As shown in FIG. 7(B), X-ray photoelectron spectroscopy spectra after Ar ion etching were not so much different among Example 11, Example 12, and Comparative Example 5 as compared to those before Ar ion etching.

Peak areas A and B for the exposed surface after Ar ion etching were determined in the same manner as for the surface before Ar ion etching, and the ratio between peak area A and peak area B, (B/A)', was calculated. The results were as shown in Table 7.

(Evaluation of Transparent Conductors)

Work function, total light transmittance (transmittance), surface resistance values, flexibility, and corrosion resistance were determined for Example 11, Example 12, and Comparative Example 5 in the same manner as in Example 1. The results are shown in Table 6.

TABLE 6

|  | Example 11 | | Example 12 | | Comparative Example 5 | |
| --- | --- | --- | --- | --- | --- | --- |
| Work function (eV) | 5.08 | | 4.73 | | 4.46 | |
|  | n = 1 | n = 2 | n = 1 | n = 2 | n = 1 | n = 2 |
| Peak area A | 324,514 | 321,038 | 331,742 | 326,497 | 318,145 | 310,989 |
| Peak area B | 206 | 211 | 199 | 170 | 343 | 363 |
| Ratio (B/A) (average value) | $6.6 \times 10^{-4}$ | | $5.6 \times 10^{-4}$ | | $1.1 \times 10^{-3}$ | |
| Transmittance (%) | 88.8 | | 88.3 | | 88.5 | |
| Surface resistance value (Ω/sq.) | 8.9 | | 8.6 | | 8.8 | |
| Flexibility (Ω/sq.) | A (8.9) | | A (8.6) | | A (8.8) | |
| Corrosion resistance | A | | A | | A | |

Figure 11:
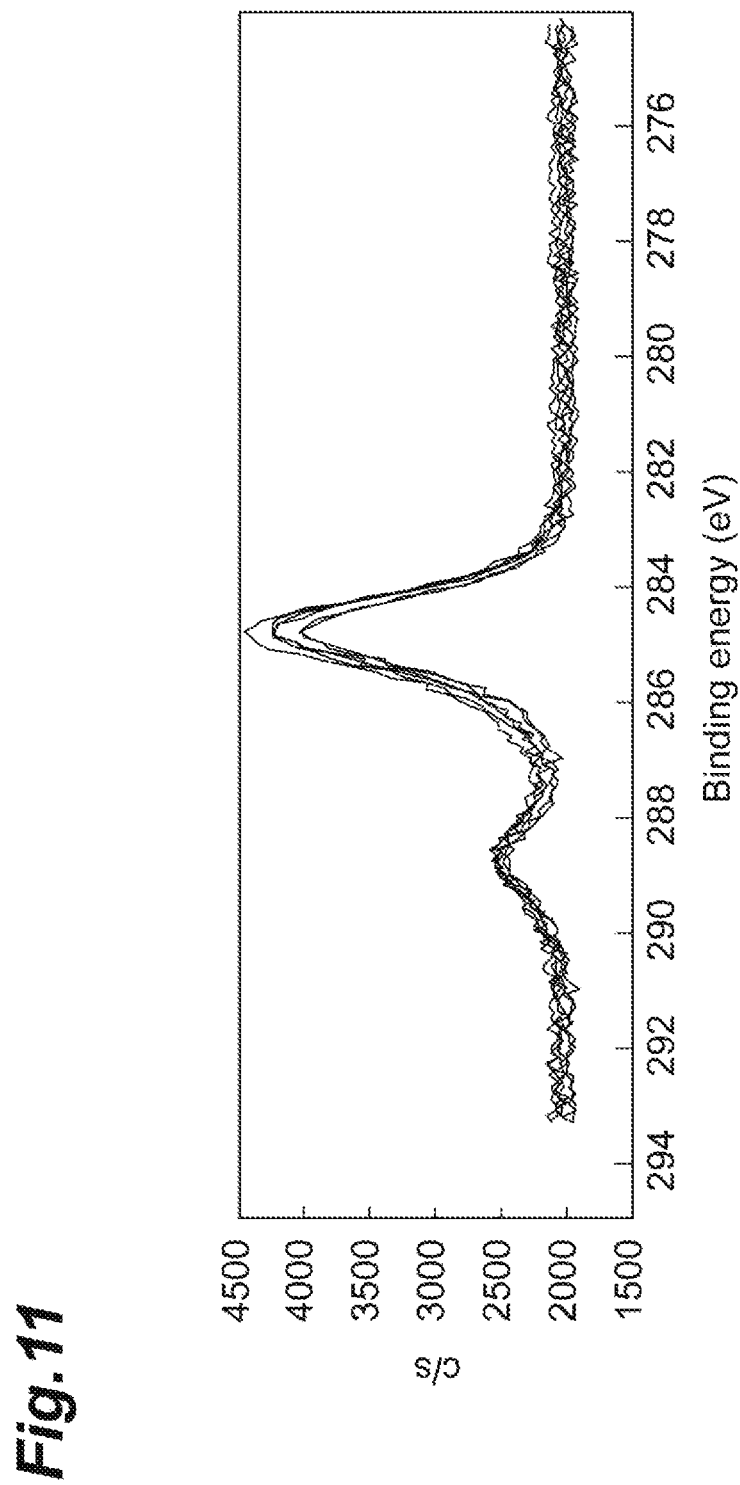
FIG. 11 shows X-ray photoelectron spectroscopy spectra in a binding energy region of around 276 to 293 eV for the surface (before Ar ion etching) of the second metal oxide layer in Example 11, Example 12, and Comparative Example 5.

FIG. 11 shows X-ray photoelectron spectroscopy spectra in a binding energy region of around 276 to 293 eV for the surface of the second metal oxide layer in Example 11, Example 12, and Comparative Example 5 before Ar ion etching. The peak around 284.8 eV is derived from carbon [C1s]. This peak was observed almost at the same position in X-ray photoelectron spectroscopy spectra for Example 11, Example 12, and Comparative Example 5.

From the X-ray photoelectron spectroscopy spectra determined as described above, peak area A in a binding energy As shown in Table 6, the transparent conductors in Example 11 and Example 12, each of which had a value of the ratio (B/A) smaller than that in Comparative Example 5, had work function higher than that in Comparative Example 5. The transparent conductor in Example 11 had the highest work function. The transparent conductors in Example 11 and Example 12 each had high total light transmittance, and the surface resistance values were sufficiently low. In addition, the transparent conductors in Example 11 and Example 12 were superior in flexibility and corrosion resistance.

TABLE 7

| | Example 11 | | Example 12 | | Comparative Example 5 | |
|---|---|---|---|---|---|---|
| | n = 1 | n = 2 | n = 1 | n = 2 | n = 1 | n = 2 |
| Peak area A | 358,578 | 354,622 | 383,789 | 374,225 | 368,134 | 360,310 |
| Peak area B | 355 | 341 | 463 | 395 | 449 | 444 |
| Ratio (B/A)' (average value) | $9.8 \times 10^{-4}$ | | $1.1 \times 10^{-3}$ | | $1.2 \times 10^{-3}$ | |

As shown in Table 7, values of the ratio (B/A)' were not so much different among Example 11, Example 12, and Comparative Example 5 as compared to those of the ratio (B/A) in Table 6. For both of Example 11 and Example 12, the ratio (B/A) in Table 6 was smaller than the ratio (B/A)' in Table 7. From this, it is inferred that work function is higher as the position approaches the surface of the second metal oxide layer.

INDUSTRIAL APPLICABILITY

According to the present disclosure, a transparent conductor superior in conductivity, flexibility, and corrosion resistance can be provided. With inclusion of the transparent conductor, an organic device that has superior performance and at the same time is superior in flexibility and corrosion resistance can be provided. According to the present disclosure, a transparent conductor that has superior conductivity and at the same time has high work function can be provided. With inclusion of the above-described transparent conductor, an organic device that has superior performance can be provided.

REFERENCE SIGNS LIST

10, 10A, 10B: transparent conductor, 11: transparent substrate, 12: first metal oxide layer, 16: second metal oxide layer, 14: third metal oxide layer, 16a: surface, 18: metal layer, 20: transparent electrode, 21: first laminated part, 22: second laminated part, 30: hole transport layer, 40: luminescent layer, 50: electron transport layer, 60: metal electrode, 80: power source, 100: organic device.

The invention claimed is:

1. A transparent conductor comprising:
a transparent substrate;
a first metal oxide layer;
a metal layer containing a silver alloy; and
a second metal oxide layer, in an order presented, wherein
the first metal oxide layer is composed of a metal oxide which is different from ITO,
the second metal oxide layer contains ITO,
a work function of a surface of the second metal oxide layer opposite to a metal layer side is 4.5 eV or higher, and
a carrier density of the second metal oxide layer is $3.5 \times 10^{20}$ cm$^{-3}$ or lower.

2. The transparent conductor according to claim 1, further comprising a third metal oxide layer between the metal layer and the second metal oxide layer, wherein the third metal oxide layer is composed of a metal oxide which is different from ITO, and contains zinc oxide, indium oxide, titanium oxide, and tin oxide.

3. The transparent conductor according to claim 2, wherein the first metal oxide layer contains zinc oxide, indium oxide, and titanium oxide.

4. The transparent conductor according to claim 1, wherein the first metal oxide layer contains zinc oxide, indium oxide, and titanium oxide.

5. The transparent conductor according to claim 1, wherein a thickness of the second metal oxide layer is 2 nm or larger.

6. The transparent conductor according to claim 1, wherein a surface resistance value in a second metal oxide layer side is 30 Ω/sq or lower.

7. An organic device comprising:
the transparent conductor according to claim 1.

* * * * *